(12) United States Patent
Yukawa et al.

(10) Patent No.: US 8,604,547 B2
(45) Date of Patent: Dec. 10, 2013

(54) MEMORY ELEMENT AND SEMICONDUCTOR DEVICE

(75) Inventors: Mikio Yukawa, Atsugi (JP); Tamae Takano, Atsugi (JP); Yoshinobu Asami, Atsugi (JP); Shunpei Yamazaki, Setagaya (JP); Takehisa Sato, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1486 days.

(21) Appl. No.: 11/795,476

(22) PCT Filed: Feb. 7, 2006

(86) PCT No.: PCT/JP2006/002413
§ 371 (c)(1),
(2), (4) Date: Jul. 18, 2007

(87) PCT Pub. No.: WO2006/085633
PCT Pub. Date: Aug. 17, 2006

(65) Prior Publication Data
US 2008/0149733 A1    Jun. 26, 2008

(30) Foreign Application Priority Data
Feb. 10, 2005    (JP) ................................. 2005-035297

(51) Int. Cl.
*H01L 27/12* (2006.01)
*H01L 21/70* (2006.01)

(52) U.S. Cl.
USPC ......................................... 257/350; 257/390

(58) Field of Classification Search
None
See application file for complete search history.

(56) References Cited

U.S. PATENT DOCUMENTS 5,171,715 A * 12/1992 Husher et al. ................. 438/600
5,278,790 A *  1/1994 Kanabara ................. 365/189.05
(Continued)

FOREIGN PATENT DOCUMENTS

EP    0510667 A    10/1992
EP    1229552 A     8/2002
(Continued)

OTHER PUBLICATIONS

International Search Report (Application No. PCT/JP2006/302413) dated Apr. 25, 2006.

(Continued)

*Primary Examiner* — Hoang-Quan Ho
(74) *Attorney, Agent, or Firm* — Eric J. Robinson; Robinson Intellectual Property Lay Office, P.C.

(57) ABSTRACT

It is an object of the present invention to provide a nonvolatile memory device, in which additional writing is possible other than in manufacturing and forgery and the like due to rewriting can be prevented, and a semiconductor device having the memory device. It is another object of the present invention to provide an inexpensive and nonvolatile memory device with high reliability and a semiconductor device. According to one feature of the present invention, a memory device includes a first conductive layer formed over an insulating surface, a second conductive layer, a first insulating layer interposed between the first conductive layer and the second conductive layer, and a second insulating layer which covers a part of the first conductive layer, wherein the first insulating layer covers an edge portion of the first conductive layer, the insulating surface, and the second insulating layer.

32 Claims, 17 Drawing Sheets

(56) References Cited

U.S. PATENT DOCUMENTS

| | | | |
|---|---|---|---|
| 5,311,053 A * | 5/1994 | Law et al. | 257/529 |
| 5,364,811 A | 11/1994 | Ajika et al. | |
| 5,412,641 A | 5/1995 | Shinjo et al. | |
| 5,416,355 A * | 5/1995 | Kudoh | 257/529 |
| 5,424,986 A * | 6/1995 | McClure | 365/200 |
| 5,428,237 A | 6/1995 | Yuzurihara et al. | |
| 5,612,230 A | 3/1997 | Yuzurihara et al. | |
| 5,682,059 A * | 10/1997 | Yoshii et al. | 257/530 |
| 5,751,647 A * | 5/1998 | O'Toole | 365/200 |
| 5,760,439 A * | 6/1998 | Tanaka et al. | 257/323 |
| 5,834,824 A * | 11/1998 | Shepherd et al. | 257/530 |
| 5,866,938 A * | 2/1999 | Takagi et al. | 257/530 |
| 6,097,059 A * | 8/2000 | Yamada | 257/321 |
| 6,146,999 A * | 11/2000 | Kang et al. | 438/662 |
| 6,274,388 B1 | 8/2001 | Aggarwal et al. | |
| 6,458,630 B1 * | 10/2002 | Daubenspeck et al. | 438/131 |
| 6,583,490 B2 | 6/2003 | Hagiwara et al. | |
| 6,621,324 B2 * | 9/2003 | Fifield et al. | 327/525 |
| 6,800,527 B2 | 10/2004 | Hagiwara et al. | |
| 6,808,985 B1 * | 10/2004 | Lee et al. | 438/257 |
| 6,859,389 B2 | 2/2005 | Idehara | |
| 6,872,989 B2 | 3/2005 | Inoue et al. | |
| 6,897,543 B1 * | 5/2005 | Huang et al. | 257/530 |
| 6,900,084 B1 | 5/2005 | Yamazaki | |
| 7,022,530 B2 | 4/2006 | Morita et al. | |
| 7,051,205 B1 | 5/2006 | Horiguchi et al. | |
| 7,119,662 B1 | 10/2006 | Horiguchi et al. | |
| 7,159,241 B1 | 1/2007 | Horiguchi et al. | |
| 7,170,110 B2 | 1/2007 | Inoue et al. | |
| 7,323,715 B2 | 1/2008 | Yamazaki | |
| 7,338,859 B2 | 3/2008 | Park | |
| 7,355,879 B2 * | 4/2008 | Hirai et al. | 365/148 |
| 7,361,924 B2 | 4/2008 | Breuil et al. | |
| 7,499,305 B2 | 3/2009 | Nomura et al. | |
| 7,518,692 B2 | 4/2009 | Yamazaki et al. | |
| 7,541,614 B2 | 6/2009 | Kato | |
| 7,781,758 B2 | 8/2010 | Abe et al. | |
| 7,858,985 B2 | 12/2010 | Kato | |
| 8,049,219 B2 | 11/2011 | Kato | |
| 2002/0052080 A1 * | 5/2002 | Lee | 438/257 |
| 2002/0182837 A1 | 12/2002 | Daubenspeck et al. | |
| 2003/0081446 A1 | 5/2003 | Fricke et al. | |
| 2003/0156449 A1 | 8/2003 | Ooishi | |
| 2003/0161175 A1 | 8/2003 | Fricke et al. | |
| 2003/0227793 A1 | 12/2003 | Tsujioka | |
| 2004/0183647 A1 * | 9/2004 | Arai et al. | 338/13 |
| 2004/0184331 A1 | 9/2004 | Hanzawa et al. | |
| 2006/0280010 A1 | 12/2006 | Hanzawa et al. | |
| 2007/0141731 A1 * | 6/2007 | Hemink et al. | 438/14 |
| 2007/0215869 A1 * | 9/2007 | Moriya et al. | 257/40 |
| 2008/0087982 A1 | 4/2008 | Fujii | |
| 2008/0206931 A1 | 8/2008 | Breuil et al. | |
| 2008/0283616 A1 * | 11/2008 | Yukawa et al. | 235/492 |

FOREIGN PATENT DOCUMENTS

| | | |
|---|---|---|
| EP | 1 437 683 | 7/2004 |
| JP | 02-239664 A | 9/1990 |
| JP | 05-167043 A | 7/1993 |
| JP | 05-314549 A | 11/1993 |
| JP | 07-211873 A | 8/1995 |
| JP | 09-055476 A | 2/1997 |
| JP | 2001-168295 | 6/2001 |
| JP | 2001-357377 | 12/2001 |
| JP | 2002-026277 | 1/2002 |
| JP | 2002-231899 A | 8/2002 |
| JP | 2003-078111 | 3/2003 |
| JP | 2003-264187 | 9/2003 |
| JP | 2004-128471 | 4/2004 |
| JP | 2004-153047 A | 5/2004 |
| JP | 2004-220591 A | 8/2004 |
| JP | 2004-266167 A | 9/2004 |
| JP | 2004-273538 | 9/2004 |
| JP | 2004-297048 A | 10/2004 |
| WO | WO 98/05071 | 2/1998 |
| WO | WO 98/05074 | 2/1998 |
| WO | WO 98/57380 | 12/1998 |
| WO | WO 2004/015778 | 2/2004 |
| WO | WO2006062175 A1 * | 6/2006 |
| WO | WO2006080550 A1 * | 8/2006 |

OTHER PUBLICATIONS

Written Opinion (Application No. PCT/JP2006/302413) dated Apr. 25, 2006.

Search Report (European Application No. 06713555.8) dated May 8, 2008.

* cited by examiner

MEMORY ELEMENT AND SEMICONDUCTOR DEVICE

TECHNICAL FIELD

The present invention relates to a memory device and a semiconductor device provided with the memory device.

BACKGROUND ART

In recent years, a semiconductor device having various functions, in which a plurality of circuits are integrated over an insulating surface, has been developed. Moreover, a semiconductor device which can conduct wireless transmission/reception of data by providing an antenna has been developed. Such a semiconductor device is referred to as a wireless chip (also referred to as an ID tag, an IC tag, an IC chip, a RF (Radio Frequency) tag, a wireless tag, an electronic tag, or a RFID (Radio Frequency Identification)) tag, and has already brought to part of the market.

Many of these semiconductor devices that have already been put into practical use have a circuit using a semiconductor substrate such as a Si substrate (also referred to as an IC (Integrated Circuit) chip) and an antenna, and the IC chip includes a memory circuit (also referred to as a memory), a control circuit, and the like. In particular, by providing a memory circuit which can store much data, a semiconductor device with high added value providing higher performance can be provided. In addition, such semiconductor devices are required to be manufactured at a low cost. In recent years, an organic TFT, an organic memory, and the like using an organic compound for a control circuit, a memory circuit, and the like have been actively developed (for example, Reference 1: Japanese Patent Laid-Open No. 2002-26277).

DISCLOSURE OF INVENTION

As a memory circuit, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, and the like are given. Among them, a DRAM and a SRAM are volatile memory circuits in which data is erased when power source is turned off; therefore, it is necessary to write data every time the power source is turned on. Although an FeRAM is a nonvolatile memory circuit, a manufacturing step thereof is increased because a capacitor element including a ferroelectric layer is used. A mask ROM has a simple structure; however, it is necessary to write data during a manufacturing process, and data cannot be rewritten. An EPROM, an EEPROM, and a flash memory are nonvolatile memory circuits; however, a manufacturing step thereof is increased because an element having two gate electrodes is used.

On the other hand, a memory element is formed by providing an organic compound layer between a pair of electrodes in a memory circuit. However, when a thickness of an organic compound layer is made to be thick, current does not easily flow and a drive voltage is needed to be increased.

In view of the foregoing problems, it is an object of the present invention to provide a nonvolatile memory device, in which data can be written once other than in manufacturing and forgery and the like due to rewriting can be prevented, and a semiconductor device having the memory device. It is another object of the present invention to provide a memory device and a semiconductor device with high reliability, which are inexpensive and nonvolatile.

According to one feature of the present invention, a memory device includes a first conductive layer formed over an insulating surface, a second conductive layer, a first insulating layer interposed between the first conductive layer and the second conductive layer, and a second insulating layer which covers a part of the first conductive layer, wherein the first insulating layer covers an edge portion of the first conductive layer, the insulating surface, and the second insulating layer.

According to another feature of the present invention, a memory device includes a memory cell array in which memory elements are arranged in matrix; and a writing circuit, wherein the memory element includes a first conductive layer formed over an insulating surface, a second conductive layer, a first insulating layer interposed between the first conductive layer and the second conductive layer, and a second insulating layer which covers a part of the first conductive layer, wherein the first insulating layer covers an edge portion of the first conductive layer, the insulating surface, and the second insulating layer.

According to another feature of the present invention, a memory device includes a memory cell array in which memory elements are arranged in matrix; and a writing circuit, wherein the memory cell includes a transistor and a memory element, wherein the memory element includes a first conductive layer formed over an insulating surface, a second conductive layer, a first insulating layer interposed between the first conductive layer and the second conductive layer, and a second insulating layer which covers a part of the first conductive layer, wherein the first insulating layer covers an edge portion of the first conductive layer, the insulating surface, and the second insulating layer.

According to another feature of the present invention, a semiconductor device includes a first transistor; a second transistor; a memory element which is connected to a conductive layer functioning as a source wiring or a drain wiring of the first transistor; and a conductive layer functioning as an antenna which is connected to a conductive layer functioning as a source wiring or a drain wiring of the second transistor, wherein the memory element includes a first conductive layer formed over an insulating surface, a second conductive layer, a first insulating layer interposed between the first conductive layer and the second conductive layer, and a second insulating layer which covers a part of the first conductive layer, wherein the first insulating layer covers an edge portion of the first conductive layer, the insulating surface, and the second insulating layer.

The first transistor, the second transistor, the memory element, and the conductive layer functioning as an antenna may be formed on a first substrate.

The first transistor may be formed on the first substrate, the memory element is formed on a second substrate, and the conductive layer functioning as a source wiring or a drain wiring of the first transistor and the memory element are connected to each other through a conductive particle.

The second transistor may be formed on the first substrate, the conductive layer functioning as an antenna is formed on the second substrate, and the conductive layer functioning as a source wiring or a drain wiring of the second transistor and the conductive layer functioning as an antenna are connected to each other through a conductive particle.

Further, a pair of the first conductive layer and the second conductive layer may be partly connected to each other.

The edge portion of the first conductive layer may have a tapered shape. Typically, the edge portion of the first conductive layer is preferably inclined with respect to the insulating surface in the range of 10 degrees or more and less than 85 degrees.

The edge portion of the first conductive layer may have a curved surface. Typically, the edge portion of the first conductive layer is outwardly curved (convex curve) or inwardly curved (concave curve).

In addition, the memory cell array and the writing circuit are provided over a glass substrate or a flexible substrate, and the writing circuit is formed of a thin film transistor.

Moreover, the memory cell array and the writing circuit may be provided on a single crystal semiconductor substrate, and the writing circuit may be formed of a field effect transistor.

A resistance value of the memory element may be changed by light irradiation. At this time, the first insulating layer may be formed from a conjugated polymer material doped with a photoacid generator.

In addition, a resistance value of the memory element is changed by an electric action from outside. The first insulating layer of the memory element is an insulating layer whose crystal condition, conductivity, or shape is changed by an electric action or light irradiation. At this time, the first insulating layer may be formed from an organic compound of an electron transporting material or a hole transporting material, or formed of an inorganic insulating layer or a mixed layer of an organic compound and an inorganic compound.

According to another feature of the present invention, the semiconductor device having the above-described structure includes one or more of a power supply circuit, a clock generating circuit, a data demodulation/modulation circuit, a control circuit, and an interface circuit.

By using the present invention, a semiconductor device can be obtained, in which forgery due to rewriting can be prevented and data can be written (written once) other than in manufacturing a chip. Further, a memory element can reduce a drive voltage in writing of data due to a structure in which an insulating layer which is changed by an electric action or light irradiation covers a base insulating surface, an edge portion of a first conductive layer, and a partition wall (the second insulating layer). As a result, a memory device and a semiconductor device consuming low power can be provided. Further, a memory device and a semiconductor device which are inexpensive can be provided since a memory device and a semiconductor device according to the present invention have a memory element having a simple structure in which an insulating layer is interposed between a pair of conductive layers.

BEST MODE FOR CARRYING OUT THE INVENTION

Embodiment modes according to the present invention are described in detail with reference to the drawings. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the present invention. Through the drawings of the embodiments, like components are denoted by like numerals as of these embodiments with each other and will not be further explained.

Embodiment Mode 1

In this embodiment mode, one example of a structure of a memory element included in a memory device according to the invention will be explained with reference to drawings. More specifically, a case where the structure of the memory device is a passive matrix type is shown.

Figure 1A:
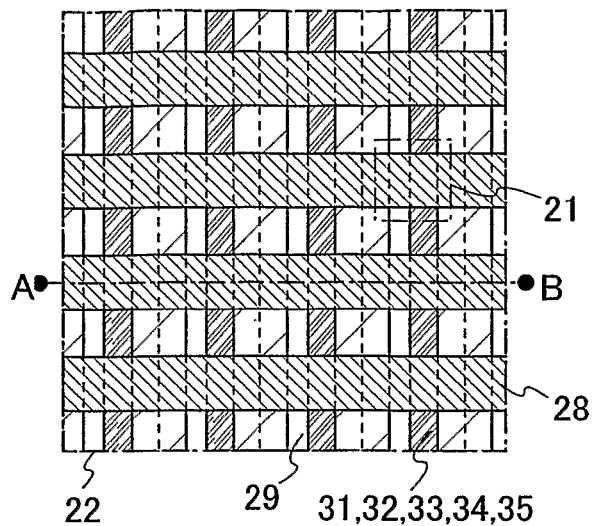
FIGS. 1A to 1F are a top view and cross-sectional views explaining a memory device according to the present invention.
Figure 1B:
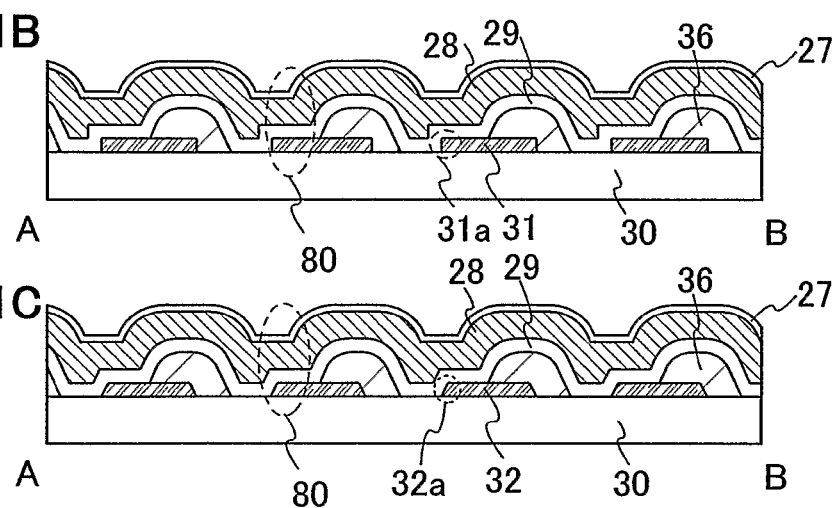

FIG. 1A shows a top structure of a memory cell array 22 included in the memory device according to the invention, and a cross-sectional structure taken along A-B in FIG. 1A corresponds to FIGS. 1B to 1F.

In the memory cell array 22, memory cells 21 are arranged in matrix (refer to FIG. 1A). The memory cell 21 includes a memory element 80. The memory element 80 includes a first conductive layer 31 extended in a first direction; a partition wall (insulating layer) 36 which covers a part of the first conductive layer 31; an insulating layer 29 which covers the first conductive layer 31, a substrate 30, and the partition wall (insulating layer) 36; and a second conductive layer 28 extended in a second direction perpendicular to the first direction, over the substrate 30 having an insulating surface. Here, an insulating layer 27 which functions as a protective film is provided so as to cover the second conductive layer 28 (refer to FIG. 1B).

Here, the partition wall (insulating layer) 36 is provided in a stripe form in the first direction parallel to the first conductive layer 31, and covers a first edge portion of the first conductive layer 31. The insulating layer 29 has a structure which covers at least a part of an edge portion of the first conductive layer 31, a part of a surface of the substrate 30, and a part of the partition wall (insulating layer) 36. Here, the insulating layer 29 is provided over the entire surface of the substrate 30.

The first conductive layer 31 and the second conductive layer 28 are formed from a highly conductive element, compound, or the like. The insulating layer 29 is formed from a substance in which a crystal condition, conductivity, or shape is changed by an electric action or light irradiation. The conductivity of the memory element having the above structure is changed before and after an electric action or light irradiation; therefore, two values corresponding to "an initial state" and "a state after changing in conductivity" can be stored.

It is to be noted that the electric action indicates that voltage is applied between the first conductive layer 31 and the second conductive layer 28.

Figure 2A:
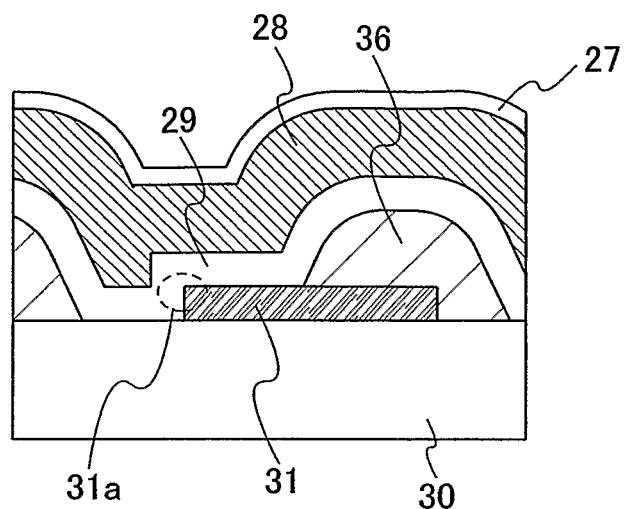
FIGS. 2A to 2C are cross-sectional views explaining a memory device according to the invention.
Figure 2B:
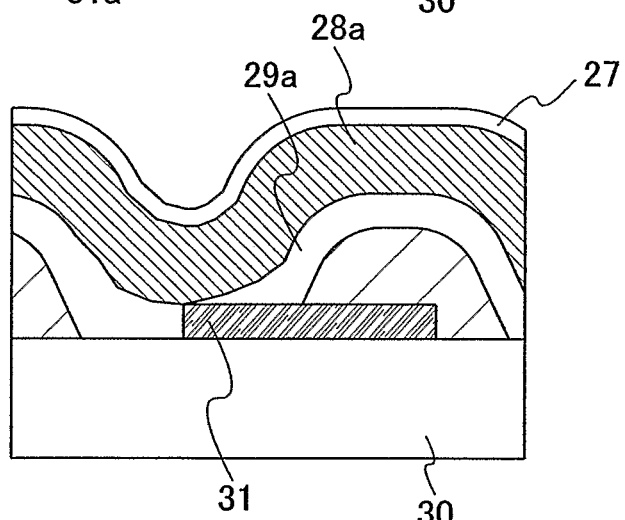
Figure 2C:
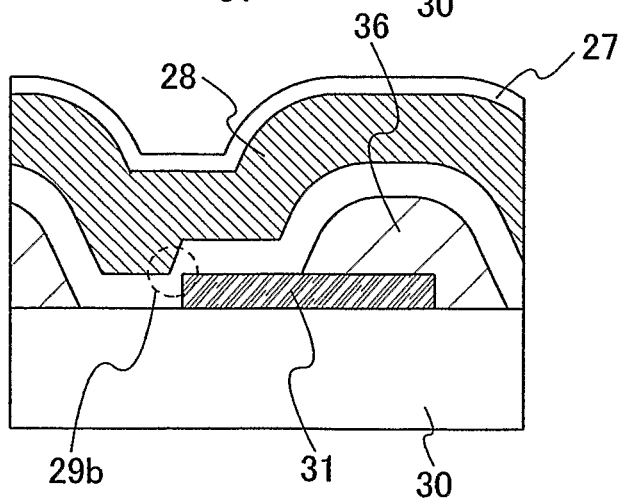

Here, the change of conductivity of the memory element before and after applying voltage will be explained with reference to FIGS. 2A to 2C. When voltage is applied between a first conductive layer 31 and a second conductive layer 28, the first conductive layer 31 and the second conductive layer 28 are short-circuited, and accordingly, conductivity of the memory element is increased. This is explained as follows: When voltage is applied, current flows in an insulating layer 29 and Joule heat is generated. With the generation of the heat, a temperature of the insulating layer rises to glass transition point or more, fluidity of the insulating layer is increased, and a film thickness thereof becomes uneven. In particular, the insulating layer with increased fluidity is easily moved in an edge portion 31a of the first conductive layer 31 (refer to FIG. 2A). As a result, the insulating layer 29 and the second conductive layer are transformed, and accordingly, the first conductive layer 31 and a second conductive layer 28a, which have been transformed, are short-circuited and conductivity of the memory element is increased. It is to be noted that reference numeral 29a is a transformed insulating layer in FIG. 2B (refer to FIG. 2B).

There is also a case where dielectric breakdown occurs in the insulating layer 29 when voltage is applied between the first conductive layer 31 and the second conductive layer 28. This is because dielectric breakdown easily occurs in the insulating layer 29 since electric field is easily concentrated in the edge portion of the first conductive layer 31. In particular, dielectric breakdown easily occurs in a region 29b where the coverage of the insulating layer 29 is low and a film is thin in the edge portion of the first conductive layer 31 (refer to FIG. 2C).

As a result, writing can be conducted at low voltage. In other words, writing can be conducted with low power consumption.

The edge portion 31a of the first conductive layer shown in FIG. 1A may be perpendicular to the substrate 30. Here, "perpendicular" means that a side surface of the edge portion of the first conductive layer has an angle of 85 degrees or more and 90 degrees or less with respect to the substrate 30.

In addition, a first conductive layer having an edge portion of a tapered shape can be formed by applying an etching condition appropriately. The tapered shape indicates that a side surface of the first conductive layer is inclined with respect to a lower layer (here, the substrate 30) of the first conductive layer. Preferably, the side surface of the first conductive layer has a tilt angle of 10 degrees or more and less than 85 degrees, preferably, 60 degrees or more and 80 degrees or less, or a tilt angle of 95 degrees or more and 135 degrees or less with respect to the lower layer of the first conductive layer.

Figure 1C:
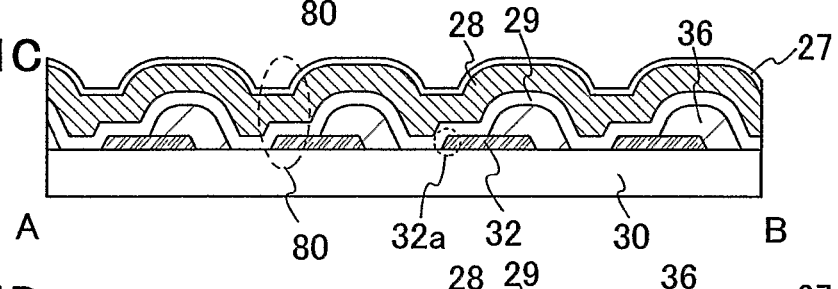
Figure 1D:
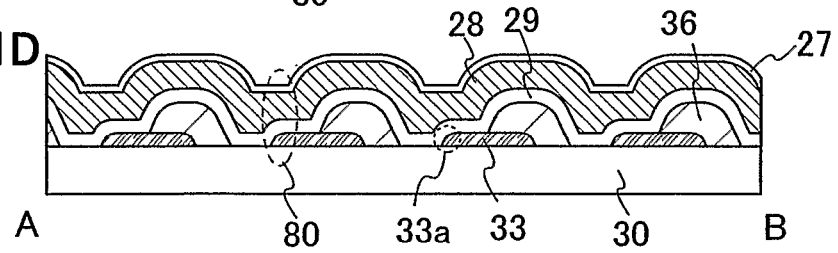

FIG. 1C shows a first conductive layer 32 including an edge portion 32a having a tapered shape in which a tilt angle is in the range of 10 degrees or more and 85 degrees or less, preferably, 60 degrees or more and 80 degrees or less.

In addition, a first conductive layer 33 including an edge portion 33a having a curvature (curved surface) can be formed. Here, the cross-sectional view of the first conductive layer has a convex curvature which is outwardly curved in the first conductive layer 33 by applying a conductive paste by a droplet discharge method, a printing method, or the like, and baking the conductive paste (refer to FIG. 1D). As a typical example of a conductive paste, one in which conductive particles of several nanometers to several micrometers in diameter are dispersed in a solvent or dispersing medium is used. As the conductive particles, metal particles, fine particles of silver halide, or dispersant nanoparticles of any one or more of Ag, Au, Cu, Ni, Pt, Pd, Ir, Rh, W, Al, Ta, Mo, Cd, Zn, Fe, Ti, Zr, and Ba can be used.

Figure 1E:
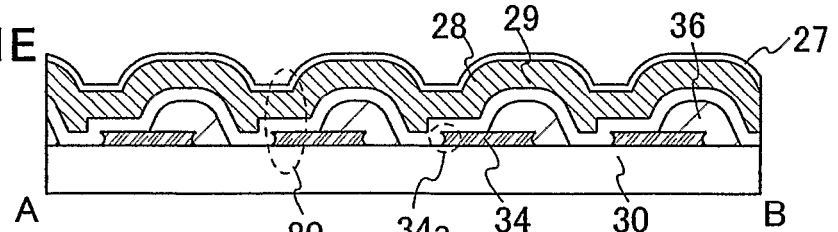

Alternatively, the cross-sectional view of a first conductive layer 34 may include an edge portion 34a having a convex curvature which is inwardly curved (curved surface) in the first conductive layer 34 (refer to FIG. 1E). The first conductive layer having the shape described above can be formed by conducting wet etching to the conductive layer.

Figure 1F:
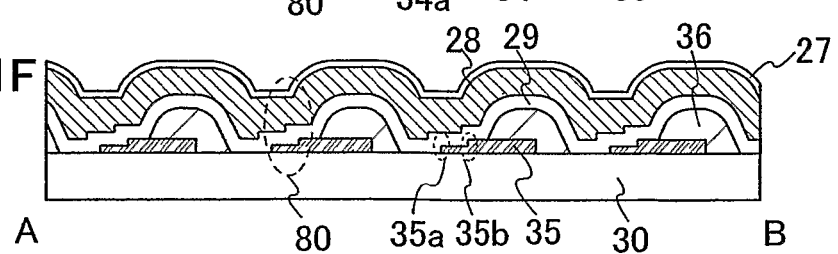

Further, the first conductive layer may include a plurality of edge portions having the shape described above in an edge portion of the memory element viewed from its top surface. FIG. 1F shows a first conductive layer 35 including a plurality of edge portions 35a and 35b.

In addition, a liquid-repellent layer may be provided over the surface of the first conductive layers 31 to 35. The liquid-repellent layer indicates a layer on which the insulating layer 29 with fluidity at a temperature of glass transition point or more shows a contact angle of 40 degrees to 150 degrees, preferably, 60 degrees to 120 degrees.

As a typical example of the liquid-repellent layer, a compound including an alkyl group or a fluorocarbon chain is given.

An organic resin including a fluorocarbon chain (fluorine-based resin) may be used. The fluorine-based resin may be polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like.

As a material which makes the insulating layer 29 with fluidity easy to repel at a temperature of glass transition point or more, organic silane represented by a chemical formula: $R_n$—Si—$X_{(4-n)}$ (n=1, 2, 3) may be used. In this formula, R denotes a group which is comparatively inactive, such as a fluoro alkyl group and an alkyl group, and X denotes halogen or a hydrolytic group capable of coupling with a hydroxyl group, such as a methoxy group, an ethoxy group, and an acetoxy group, over the surface of a substrate by condensation with the hydroxyl group.

As one example of organic silane, fluoroalkylsilane (hereinafter, also referred to as FAS) having a fluoroalkyl group as R may be used. By employing this, wettability can be lowered. The fluoroalkyl group R of FAS has a structure of $(CF_3)(CF_2)_x(CH_2)_y$, where x is an integer from 0 to 10 and y is an integer from 0 to 4. When a plurality of Rs or Xs are coupled with Si, all of the Rs or Xs may be the same or different. As a typical example of FAS, there are fluoroalkylsilane (FAS) such as heptadecafluorotetrahydrodecyltriethoxysilane, heptadecafluorotetrahydrodecyltrichlorosilane, tridecafluorotetrahydrooctyltrichlorosilane, and trifluoropropyltrimethoxysilane.

As another example of organic silane, alkoxysilane having an alkyl group as R may be employed. By employing this, wettability can be lowered. As the alkoxysilane, alkoxysilane having a carbon number of 2 to 30 is preferably used. Typically, ethyltriethoxysilane, propyltriethoxysilane, octyltriethoxysilane, decyltriethoxysilane, octadecyltriethoxysilane (ODS), eicosyltriethoxysilane, and triacontyltriethoxysilane are employed. In particular, a silane compound having a long chain alkyl group is preferably used since wettability can be lowered.

Further, as a material which makes the insulating layer easy to repel when a material of the insulating layer has fluidity at a temperature of glass transition point or more, a material on which a contact angle for the material of the insulating layer at a temperature of glass transition point or more is 30 degrees or more, preferably 40 degrees or more, can be appropriately used.

In the case where influence of electric field toward a lateral direction is concerned among memory cells which are adjacent to each other, the insulating layer 29 may be formed separately in each memory cell using a mask.

Figure 3A:
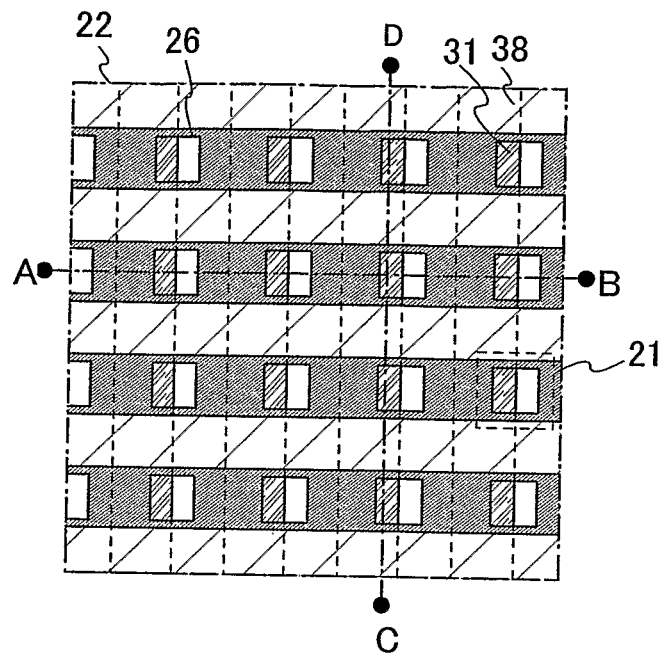
FIGS. 3A to 3C are a top view and cross-sectional views explaining a memory device according to the invention.
Figure 3B:
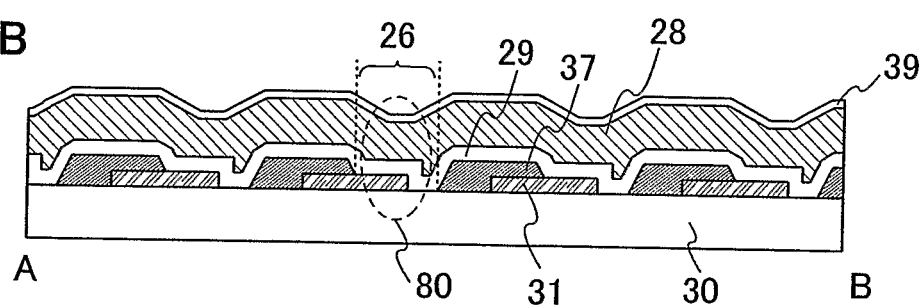
Figure 3C:
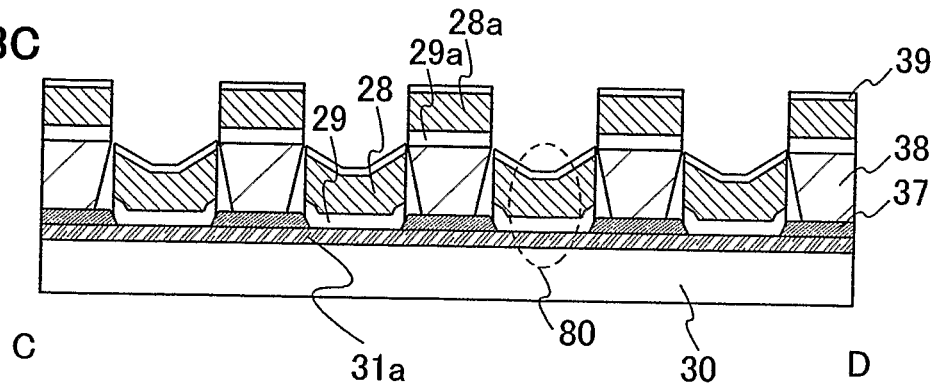

Next, a structure of a memory cell array which is different from that in FIG. 1 will be explained with reference to FIGS. 3A to 3C. FIG. 3A shows a top view of a memory cell array 22 included in a memory device according to the present invention. FIG. 3B shows a cross-sectional structure taken along A-B in FIG. 3A, and FIG. 3C shows a cross-sectional structure taken along C-D in FIG. 3A. It is to be noted that FIG. 3A is a top view at a time of forming a first conductive layer 31, an interlayer insulating layer 37, and a partition wall (insulating layer) 38 over a substrate 30, and FIGS. 3B and 3C are cross-sectional views at a time of forming the insulating layer 29, a second conductive layer 28, and an insulating layer 39 thereover.

In the memory cell array 22, memory cells 21 are arranged in matrix (refer to FIG. 3A). The memory cell 21 includes a memory element 80. The memory element 80 includes the first conductive layer 31 extended in a first direction; the interlayer insulating layer 37 which covers a part of the first conductive layer 31; and the partition wall (insulating layer) 38 having a tapered shape provided over the interlayer insulating layer, over the substrate 30 having an insulating surface (FIG. 3A). Further, an insulating layer 29 which covers the first conductive layer 31, the substrate 30, and the partition wall (insulating layer) 38; and a second conductive layer 28 extended in a second direction perpendicular to the first direction are also included (FIGS. 3B and 3C).

Here, a side surface of the partition wall (insulating layer) 38 having a tapered shape has a tilt angle of 95 degrees or more and 135 degrees or less with respect to a surface of the interlayer insulating layer.

In FIG. 3A, the interlayer insulating layer 37 which covers a part of the first conductive layer 31 has an opening portion 26 in each memory element 80. The interlayer insulating layer 37 covers one edge portion of the first conductive layer 31. In the opening portion 26, the other edge portion of the first conductive layer 31 and the substrate 30 having an insulating surface are not covered by the interlayer insulating layer 37. Further, the partition wall (insulating layer) 38 is provided in a region where the opening portion 26 is not formed in the interlayer insulating layer 37.

The partition wall (insulating layer) 38 having a tapered shape is formed from a positive type photosensitive resin having a property that a portion where light exposure is not performed remains by photolithography with adjusting the amount of light exposure or a development period so that a lower portion of pattern is etched more.

The height of the partition wall (insulating layer) 38 having a tapered shape is set so as to be larger than the total film thickness of the insulating layer 29 and the second conductive layer 28. As a result, the striped insulating layer 29 and the second conductive layer 28, which are separated into a plurality of electrically-independent regions and extended to a direction which intersects with the first direction can be formed only by a step of depositing the insulating layer 29 over the entire surface of the substrate 30 and the second conductive layer 28. Accordingly, the number of steps can be reduced. Although an insulating layer 29a and a conductive layer 28a are formed also over the partition wall (insulating layer) 38 having a tapered shape, the insulating layer 29a and the conductive layer 28a are separated from the insulating layer 29 and the second conductive layer 28.

In the structure of the memory element 80 described above, in addition to a glass substrate and a flexible substrate, a quartz substrate, a silicon substrate, a metal substrate, a stainless steel substrate, a paper formed of a fiber material, or the like can be used as the substrate 30. The flexible substrate indicates a substrate which can be bended (flexible), and for example, a plastic substrate formed of polycarbonate, polyarylate, polyethersulfone, or the like is given. In addition, a film having an adhesive layer capable of thermo-compression bonding (film formed from polypropylene, polyester, vinyl, polyvinyl fluoride, polyvinyl chloride, or the like) can be used. In addition, the memory cell array 22 can be provided in a portion over a field effect transistor (FET) formed over a semiconductor substrate such as Si or in a portion over a thin film transistor (TFT) formed over a substrate such as glass.

The first conductive layers 31 to 35 and the second conductive layer 28 are formed of a highly conductive element, compound, or the like. Typically, a single-layer structure or a stacked-layer structure formed from an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), indium (In), tin (Sn), or the like or an alloy including a plurality of the elements can be used. As the alloy including a plurality of the elements, for example, an alloy Al including Al and Ti, an alloy including Ti and C, an alloy including Al and Ni, an alloy including Al and C, an alloy including Al, Ni, and C, an alloy including Al and Mo, or the like can be used.

The first conductive layers 31 to 35 may be formed by vapor deposition, sputtering, CVD, printing, electrolytic plating, an electroless plating method, a printing method, or the like.

The second conductive layer 28 can be formed by vapor deposition, sputtering, CVD, a printing method, or a droplet discharge method. In addition, the second conductive layer 28 may have the edge portions 31a to 35a and 35b having a shape shown in FIGS. 1B to 1E. Here, the first conductive layer 31 and the second conductive layer 28 are formed in 50 to 200 nm thick by depositing titanium by vapor deposition using a metal mask. The first conductive layers 31 to 35 and the second conductive layer 28 may be formed by a different method.

In this embodiment mode, data is written to a memory cell by light irradiation or an electric action from the outside. However, when data is written by light irradiation, one or both of the first conductive layers 31 to 35 and the second conductive layer 28 is/are provided so as to have a light-transmitting property. The conductive layer having a light-transmitting property is formed of a transparent conductive material or formed to have a film thickness which transmits light without using a transparent conductive material. As the transparent conductive material, a conductive oxide material having a light-transmitting property such as indium tin oxide (ITO), zinc oxide (ZnO), indium zinc oxide (IZO), or zinc oxide added with gallium (GZO) can be used. In addition, indium tin oxide containing silicon oxide, or indium oxide containing silicon oxide and zinc oxide (ZnO) of 2 to 20 atomic % can be used.

The insulating layer 29 is formed of an organic insulator, an organic compound in which conductivity is changed by light irradiation or an electric action from the outside, an inorganic insulator, or formed of a layer in which an organic compound and an inorganic compound are mixed. The insulating layer 29 may be formed to, be a single layer or formed by stacking a plurality of layers. Moreover, a mixed layer of an organic compound and an inorganic compound and another layer formed of an organic compound in which conductivity is changed by light irradiation or an electric action from the outside may be stacked.

The insulating layer 29 is formed to have such a film thickness that conductivity of the memory element is changed by light irradiation or an electric action from the outside. A typical thickness of the insulating layer 29 is 5 to 100 nm, preferably, 10 to 60 nm.

The insulating layer 29 can be formed of silicon oxide, silicon nitride, silicon oxynitride, silicon nitride oxide, or the like.

The insulating layer 29 can be formed of an organic resin typified by polyimide, acrylic, polyamide, benzocyclobutene, epoxy, and the like.

As an organic compound capable of being included in the insulating layer 29, in which conductivity is changed by light irradiation or an electric action from the outside, an organic compound having a highly hole transporting property or an organic compound having a highly electron transporting property can be used.

As an organic compound having a highly hole transporting property, an aromatic amine-based (namely including benzene ring-nitrogen bond) compound such as 4,4'-bis[N-(1-naphthyl)-N-phenylamino]biphenyl (abbreviated to α-NPD), 4,4'-bis[N-(3-methylphenyl)-N-phenylamino]biphenyl (abbreviated to TPD), 4,4',4''-tris(N,N-diphenylamino)triphenylamine (abbreviated to TDATA), 4,4',4''-tris[N-(3-methylphenyl)-N-phenylamino]triphenylamine (abbreviated to MTDATA), or 4,4'-bis(N-(4-(N,N-di-m-tolylamino)phenyl)-N-phenylamino)biphenyl (abbreviated to DNTPD) or a phthalocyanine compound such as phthalocyanine (abbreviated to $H_2Pc$), copper phthalocyanine (abbreviated to CuPc), or vanadyl phthalocyanine (abbreviated to VOPc) can be used. The substances described here are mainly substances having hole mobility in the range of $10^{-6}$ $cm^2/Vs$ or more and $10^{-2}$ $cm^2/Vs$ or less. However, a substance other than the substances described above may be used as long as the substance has a higher transporting property of hole than that of electron.

In the case of providing the mixed layer of an organic compound and an inorganic compound, it is preferable to mix an organic compound having a highly hole transporting property and an inorganic compound which receives electron easily. According to the above described structure, a number of hole carriers are generated in an organic compound having few carriers, and a hole injecting property or transporting property which is extremely excellent is exhibited. As a result, the insulating layer 29 can obtain excellent conductivity.

As the inorganic compound which receives electron easily, metal oxide, metal nitride, or metal oxynitride of a transition metal which belongs to any of Group 4 to Group 12 in the periodic table can be used. Specifically, titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (Cox), rhenium oxide (ReOx), ruthenium oxide (RuOx), zinc oxide (ZnO), a nickel oxide (NiOx), copper oxide (CuOx), or the like can be used. Although oxide is given as a specific example here, nitride or oxynitride thereof may be surely used.

As the organic compound material having a highly electron transporting property, a material formed from a metal complex or the like having a quinoline skeleton or a benzoquinoline skeleton, such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to BAlq) can be used. Further, a material such as a metal complex having an oxazole-based or thiazole-based ligand, such as bis[2-(2-hydroxyphenyl)benzoxazolato]zinc (abbreviated to $Zn(BOX)_2$) or bis[2-(2-hydroxyphenyl)benzothiazolato] zinc (abbreviated to $Zn(BTZ)_2$) may be used. Furthermore, in addition to a metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used. The substances described here are mainly substances having electron mobility in the range of $10^{-6}$ $cm^2/Vs$ or more and $10^{-2}$ $cm^2/Vs$ or less. However, a substance other than the substances described above may be used as long as the substance has a higher transporting property of electron than that of hole.

In the case of providing the mixed layer of an organic compound and an inorganic compound, it is preferable to mix an organic compound having a highly electron transporting property and an inorganic compound which gives electron easily. According to the above described structure, a number of electron carriers are generated in an organic compound having few carriers originally, and an electron injecting property or transporting property which is extremely excellent is exhibited. As a result, an organic compound layer can obtain excellent conductivity.

As the inorganic compound which gives electron easily, alkali metal oxide, alkaline earth metal oxide, rare-earth metal oxide, alkali metal nitride, alkaline earth metal nitride, or rare-earth metal nitride can be used. Specifically, lithium oxide (LiOx), strontium oxide (SrOx), barium oxide (BaOx), erbium oxide (ErOx), natrium oxide (NaOx), lithium nitride (LiNx), magnesium nitride (MgNx), calcium nitride (CaNx), yttrium nitride (YNx), lanthanum nitride (LaNx), or the like can be used.

Further, any inorganic compound may be used as long as the inorganic compound receives electron easily from an organic compound or the inorganic compound gives electron easily to an organic compound, and various metal oxide, metal nitride, or metal oxynitride can be used in addition to aluminum oxide (AlOx), gallium oxide (GaOx), silicon oxide (SiOx), germanium oxide (GeOx), indium tin oxide (ITO), or the like.

In addition, in the case where the insulating layer 29 is of a compound of metal oxide or metal nitride and a compound having a highly hole transporting property, a compound having large steric hindrance (having not a planar structure but a spatial structure) may be added. As the compound having large steric hindrance, 5,6,11,12-tetraphenyltetracene (abbreviated to rubrene) is preferable. Alternatively, hexaphenylbenzene, t-butylperylene, 9,10-di(phenyl)anthracene, coumarin 545T, or the like can be used. Further, a dendrimer or the like is also effective.

Furthermore, a light emitting substance such as 4-dicyanomethylene-2-methyl-6-[2-(1,1,7,7-tetramethyljulolidine-9-yl)ethenyl]-4H-pyran (abbreviated to DCJT), 4-dicyanomethylene-2-t-butyl-6-[2-(1,1,7,7-tetramethyljulolidyl-9-yl) ethenyl]-4H-pyran, periflanthene, 2,5-dicyano-1,4-bis[2-(10-methoxy-1,1,7,7-tetramethyluloidine-9-yl)ethenyl] benzene, N,N'-dimethylquinacridone (abbreviated to DMQd), coumarin 6, coumarin 545T, tris(8-quinolinolato) aluminum (abbreviated to Alq$_3$), 9,9'-bianthryl, 9,10-diphenylanthracene (abbreviated to DPA), 9,10-bis(2-naphthyl)anthracene (abbreviated to DNA), 2,5,8,11-tetra-t-butyl perylene (abbreviated to TBP) or the like may be provided between a layer formed of an organic compound having a highly electron transporting property and a layer formed of an organic compound having a highly hole transporting property.

The insulating layer 29 can be formed of a material in which electric resistance is changed by light irradiation. For example, a conjugated polymer doped with a compound (photoacid generator) generating acid by means of absorbing light can be used. Here, as the conjugated polymer, polyacetylenes, polyphenylene vinylenes, polythiophenes, poly anilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF$_6$ salt, or the like can be used.

The insulating layer 29 can be formed by vapor deposition, electron beam evaporation, sputtering, CVD, or the like. The mixed layer including an organic compound and an inorganic compound can be formed by depositing each material at the same time and can be formed by combining the same type of methods or different types of methods, such as co-evaporation by resistance-heating evaporation, co-evaporation by electron beam evaporation, co-evaporation by resistance-heating evaporation and electron beam evaporation, deposition by resistance-heating evaporation and sputtering, and deposition by electron beam evaporation and sputtering.

In addition, as another method for forming the insulating layer 29, spin coating, a sol-gel method, a printing method, a droplet discharge method, or the like may be used, or the combination of the above-described method and these may also be used.

In this embodiment mode, a rectifying element may be provided between the first conductive layers 31 to 35 and the insulating layer 29. The rectifying element indicates a diode or a transistor in which a gate electrode and a drain electrode are connected. In this manner, by providing the rectifying diode, current flows only in one direction, thus reading errors are reduced and a width or margin of a reading voltage is improved. The rectifying element may be provided between the insulating layer 29 and the second conductive layer 28.

Here, a configuration of a memory device according to the invention and a method for writing data will be explained.

Figure 4A:
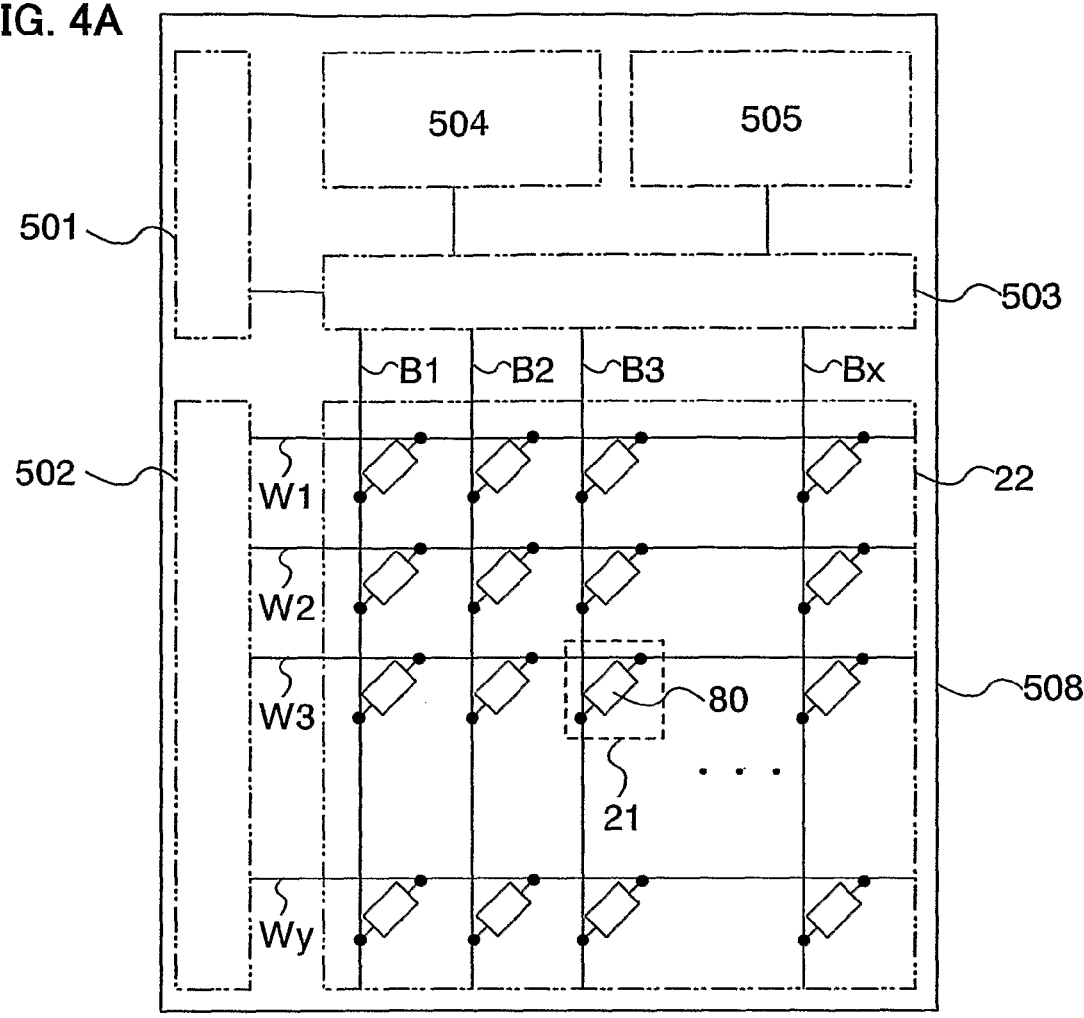
FIGS. 4A and 4B are diagrams explaining a memory device according to the invention.
Figure 4B:
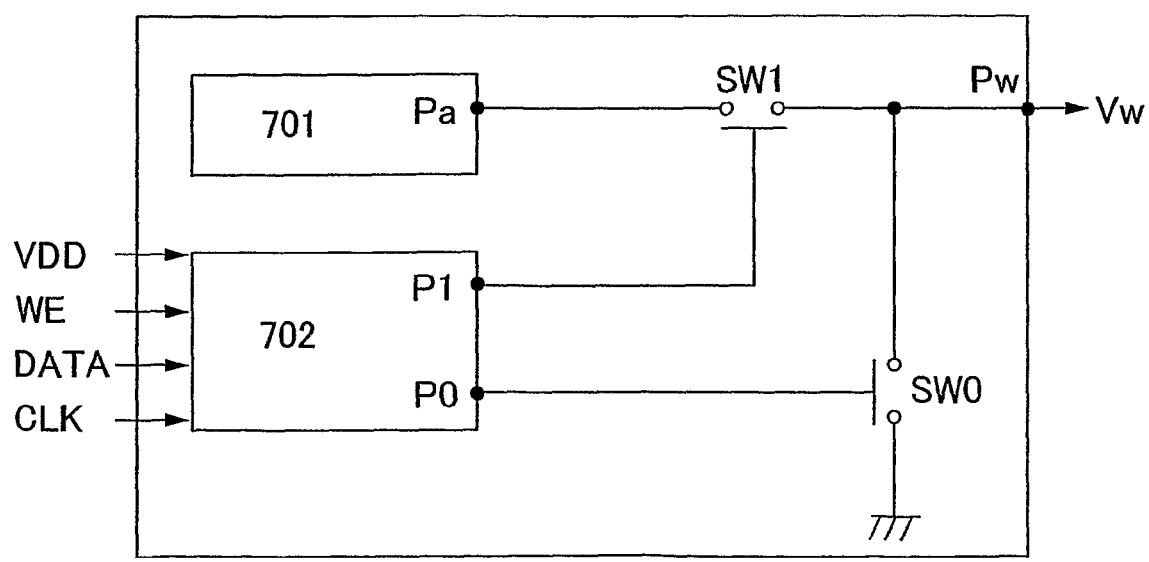

FIGS. 4A and 4B show a structure of a memory device according to the present invention. A memory device 508 according to the present invention includes a column decoder 501, a row decoder 502, a reading circuit 504, a writing circuit 505, a selector 503, and a memory cell array 22. The memory cell array 22 includes a plurality of memory cells 21. The memory cell 21 includes a memory element 80. Each of the memory elements includes a first conductive layer included in a bit line Bm(1≤m≤x), a second conductive layer included in a word line Wn(1≤n≤y), and an insulating layer provided between the bit line and the word line. It is to be noted that the structure of the memory device 508 shown here is just one example, and other circuits such as a sense amplifier, an output circuit, and a buffer may be included and a writing circuit may be provided in a bit line driver circuit.

The column decoder 501 receives an address signal to specify a column of the memory cell array, and gives a signal to the selector 503 of the specified column. The selector 503 receives the signal of the column decoder 501, and selects the bit line of the specified column. The row decoder 502 receives an address signal to specify a row of the memory cell array, and selects the word line of the specified row. According to the operation described above, one memory cell 21 corresponding to the address signal is selected. The reading circuit 504 reads data of the selected memory cell, and amplifies and outputs data. The writing circuit 505 produces voltage necessary for writing, and applies the voltage to a memory element of the selected memory cell to conduct writing of data.

FIG. 4B shows a structure of the writing circuit 505 of the memory device according to the present invention. The writing circuit 505 includes a voltage generating circuit 701, a timing control circuit 702, switches SW0 and SW1, and an output terminal Pw. The voltage generating circuit 701 is formed of a boosting circuit or the like, and produces a voltage V1 which is necessary for writing, which is outputted from an output terminal Pa. The timing control circuit 702 produces signals signal (referred to as WE), a data signal (referred to as DATA), a clock signal (referred to as CLK), and the like, and outputs the signals from output terminals P0 and P1, respectively. The switch SW0 controls ON/OFF of a connection between Pw and the ground, and the SW1 controls ON/OFF of a connection between Pw and the output terminal Pw of the voltage generating circuit 701; and accordingly, an output voltage Vw from the output terminal Pw of the writing circuit can be converted.

Next, a writing operation will be explained, while an initial state in which the conductivity of the memory element has not been changed is referred to as "0" and a short-circuit state which changes conductivity of the memory element is referred to as "1". First, an input signal WE turns to Hi, the column decoder 501 in which an address signal to specify a column is received gives a signal to the selector 503 of the specified column, and the selector 503 makes the bit line of the specified column connect to the output terminal Pw of the writing circuit. A bit line which is not specified is in a non-connection state (referred to as floating), and an output voltage Vw of the writing circuit becomes V1. Similarly, the row decoder 502, which has received an address signal to specify a row, applies a voltage V2 to the word line of the specified row and 0V is applied to a word line which is not specified. According to the above-described operation, one memory element corresponding to an address signal is selected.

When the input signal WE turns to Lo, all the word lines have 0V, and all the bit lines are in a Floating state. At the same time, the timing control circuit produces signals S0, S1=Lo, which are outputted from the output terminals P0, P1. The output terminal Pw of the writing circuit is in a Floating state. According to the operation as described above, writing is not conducted.

As described above, writing of "1" can be conducted.

Subsequently, a case where writing of data is conducted by light irradiation will be described. In this case, laser light irradiation is conducted to the insulating layer from the light-transmitting conductive layer side by using a laser irradiation apparatus.

When the insulating layer is selectively irradiated with laser light, the insulating layer is oxidized or carbonized to be insulating. Then, the resistance value of a memory element 80 that is irradiated with laser light is increased, while the resistance value of a memory element 80 that is not irradiated with laser light is not changed.

Figure 11A:
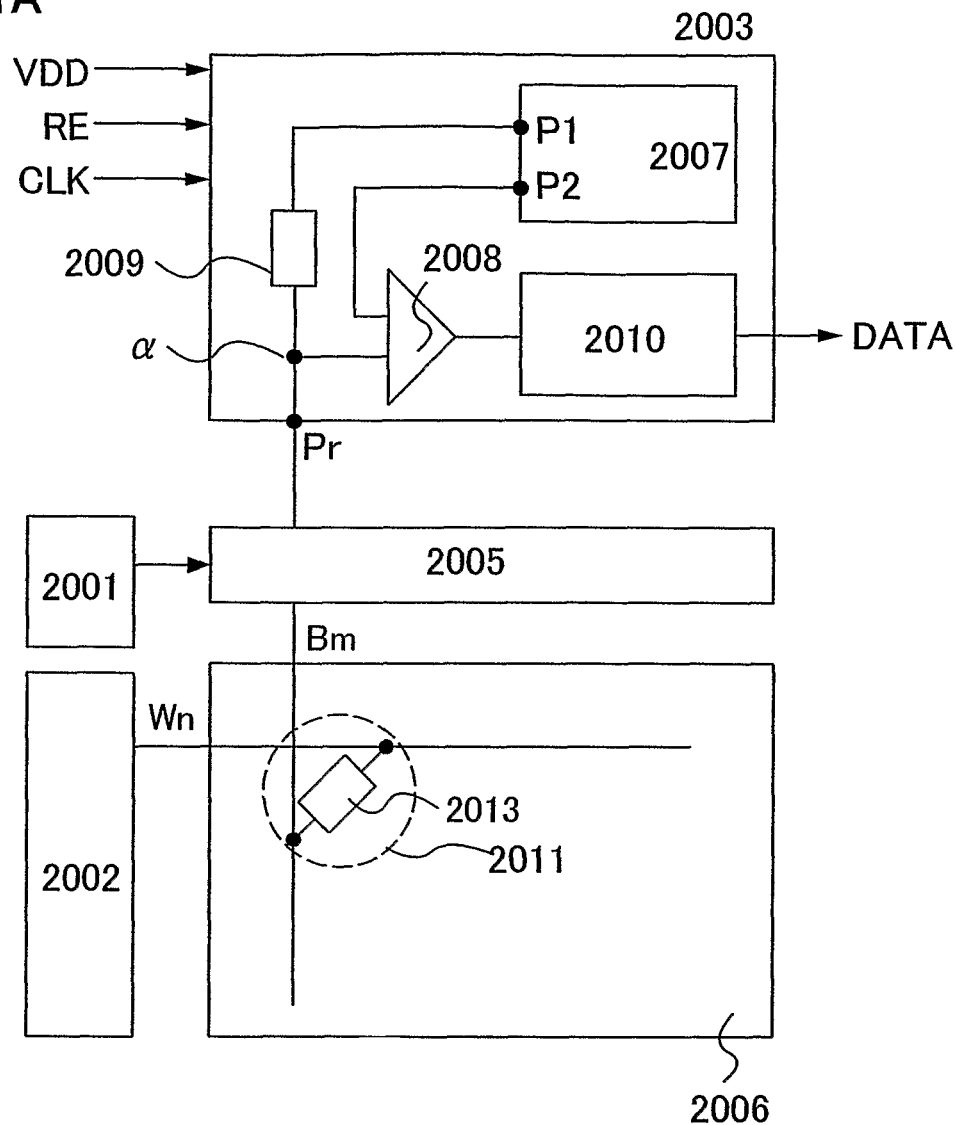
FIGS. 11A and 11B are diagrams explaining a reading circuit included in a memory device according to the invention.
Figure 11B:
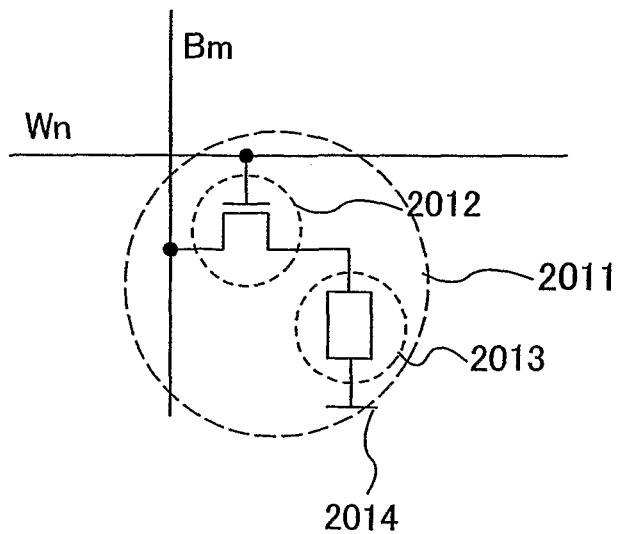

Then, reading of data will be described. FIGS. 11A and 11B show a memory device the portion of which necessary to explain reading are distilled. The memory device includes a column decoder 2001, a row decoder 2002, a reading circuit 2003, a selector 2005, and a memory cell array 2006. The memory cell array 2006 includes bit lines Bm (1≤m≤x), word lines Wn (1≤n≤y), and x×y pieces of memory cells 2011 at an intersection point of the bit lines and the word lines. In the present embodiment mode, the memory cell 2011 has a memory element 2013. The reading circuit 2003 includes a voltage generating circuit 2007, a sense amplifier 2008, a resistive element 2009, a data output circuit 2010, and an input/output terminal Pr. An input point to the sense amplifier 2008 from between the resistive element 2009 and the input/output terminal Pr is α.

The voltage generating circuit 2007 produces potentials Vread and Vref which are necessary for a reading operation, which are outputted from P1 and P2, respectively. Since low potential is used in reading of data, a power supply potential (VDD) can also be used for the potential Vread. The potential Vref is a potential lower than the potential Vread, and is produced by resistance dividing of the potential difference the power supply potential and a ground potential. Thus, the voltage generating circuit 2007 included in the reading circuit 2003 has a structure which is different from a structure of the voltage generating circuit included in the writing circuit. The sense amplifier 2008 compares levels of a potential at the point a and the potential Vref to output the result. The data output circuit 2010 is controlled by a reading control signal (hereinafter, referred to as RE). The data output circuit 2010 receives data of a memory cell from the output terminal of the sense amplifier 2008 to amplify and output the data.

Next, an operation of reading data of the memory cell 2011 of m-column and n-row will be described. First, the column decoder 2001, which has received an address signal to specify a column, gives the signal to the selector 2005 of m-column. The selector 2005 connects the bit line Bm of m-column to the input/output terminal Pr of the reading circuit. A bit line which is not specified is in a Floating state. Similarly, the row decoder 2002, which has received an address signal to specify a row, applies the potential Vread to the word line Wn of n-row and 0V to a word line which is not specified. At the same time, the potentials Vread and Vref are outputted from the output terminals P1 and P2 of the voltage generating circuit 2007. According to the operation as described above, a state is obtained, in which the potential Vread is applied to a series resistance of the resistive element 2009 and the memory element 2013, and the potential at the point a has the value obtained by resistance dividing of the two elements.

Figure 14:
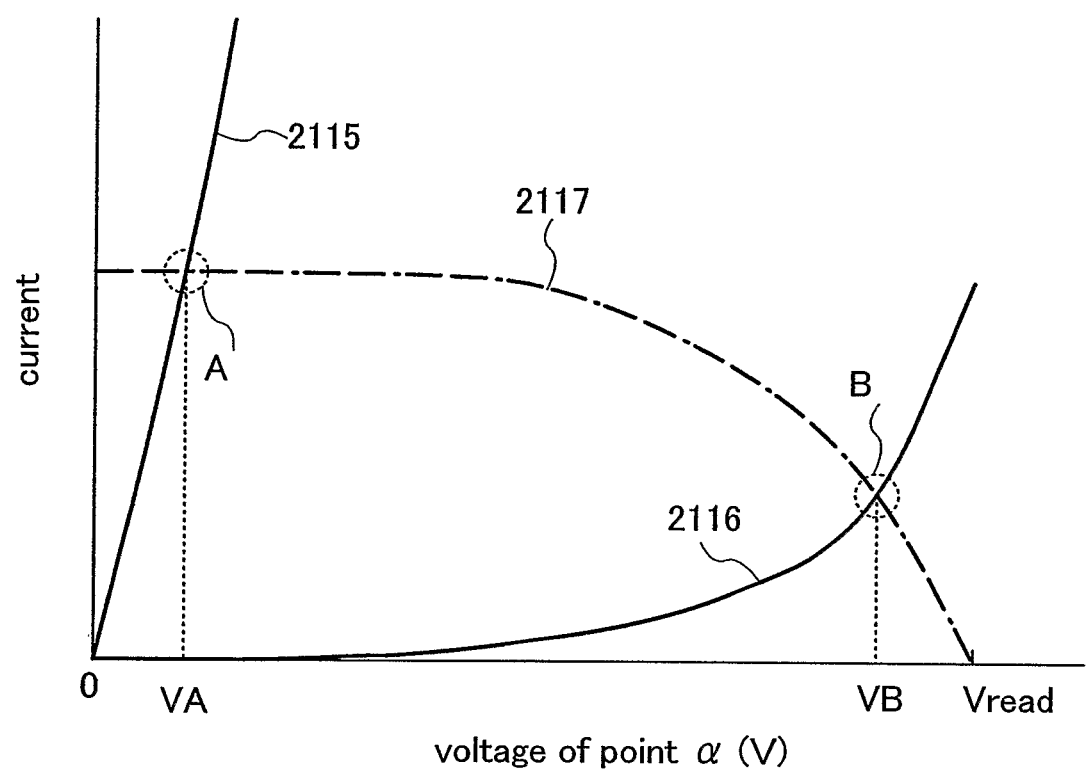
FIG. 14 is a view explaining a current-voltage characteristic of a memory element and a resistive element.

Here, FIG. 14 shows an I-V characteristic 2115 of the memory element in which writing of "1" is conducted, an I-V characteristic 2116 of the memory element in which writing of "0" is conducted, and an I-V characteristic 2117 of the resistive element 2009 in order to explain the potential which the point a can have. The resistive element 2009 is a transistor here. In addition, a horizontal axis in FIG. 14 represents the potential at the point α. As for the I-V characteristic 2115 of the memory element in which writing of "1" is conducted, a current value is drastically increased even when the potential at the point α is small because of small electric resistance of a memory element 2113. As for the I-V characteristic 2116 of the memory element in which writing of "0" is conducted, a current value is changed when the potential at the point α reaches to a certain value or more because memory element 2113 represents diode characteristics. As for the I-V characteristic 2117 of the resistive element 2009, a current value decreases when the potential at the point a increases, and the current value becomes 0 when the potential at the point α is Vread.

According to FIG. 14, the potential which the point a can have can be explained as follows: When "1" is written in the memory element 2113, a potential VA at an intersection point A of the I-V characteristic 2115 in the memory element in which writing of "1" is conducted and the I-V characteristic 2117 of the resistive element 2009 is a potential at the point α. In addition, when "0" is written in the memory element 2113, a potential VB at an intersection point B of the I-V characteristic 2116 in the memory element in which writing of "0" is conducted and the I-V characteristic 2117 of the resistive element 2009 is a potential at the point α.

Subsequently, the sense amplifier 2008 compares a level of the potential at the point α and Vref. Here, the potential Vref is larger than the potential VA and smaller than the potential VB, desirably (VA+VB)/2. By setting the potentials as described above, when the potential at the point α is judged to be smaller than Vref by the sense amplifier 2008, the potential at the point α is considered to be the potential VA, and it is found that "1" has been written in the memory element 2113. On the other hand, when the potential at the point α is judged to be larger than Vref, the potential at the point α is considered to be the potential VB, and it is found that "0" has been written in the memory element 2113.

When the potential at the point α is smaller than Vref, the sense amplifier outputs a signal representing "1". When the potential at the point α is larger than Vref, the sense amplifier outputs a signal representing "0". The data output circuit 2110 takes data from an output signal of the sense amplifier 2008, and amplifies and outputs the data based on a control signal RE inputted from the outside. According to the operation as described above, reading can be conducted.

In the present embodiment mode, the resistance value of the memory element is read by replacing it with a level of the potential, but the present invention is not limited thereto. For example, a method for reading the resistance value of a memory element by replacing it with a level of a current, or a method of precharging a bit line can also be employed.

Embodiment Mode 2

In the present embodiment mode, a memory device having a different structure from the Embodiment Mode 1 will be described. Specifically, a case where a structure of a memory device is an active matrix type will be shown.

Similarly to the memory device 508 in Embodiment Mode 1, a configuration example of a memory device shown in the present embodiment mode includes a column decoder 501, a row decoder 502, a reading circuit 504, a writing circuit 505, a selector 503, and a memory cell array 222. The memory cell array 222 includes bit lines Bm (1≤m≤x), word lines Wn (1≤n≤y), and x×y pieces of memory cells 221 at intersection points of the bit lines and the word lines (refer to FIG. 5).

The memory cell 221 has a first wiring constituting a part of the bit line Bm (1≤m≤x), a second wiring constituting a part of the word line Wn (1≤n≤y), a transistor 240, and a memory element 241. The memory element 241 has a structure in which an insulating layer is interposed between a pair of conductive layers. It is to be noted that a structure of a memory device 216 shown here is just one example, and other circuits such as a sense amplifier, an output circuit, and a buffer may be included and a writing circuit may be provided in a bit line driver circuit.

Next, one example of a top view and a cross-sectional view of the memory cell array 222 having the structure described above will be explained with reference to FIGS. 6A to 6C. It is to be noted that FIG. 6A shows one example of a top view of the memory cell array 222, and FIG. 6B shows a cross-sectional view taken along A-B in FIG. 6A.

Figure 6A:
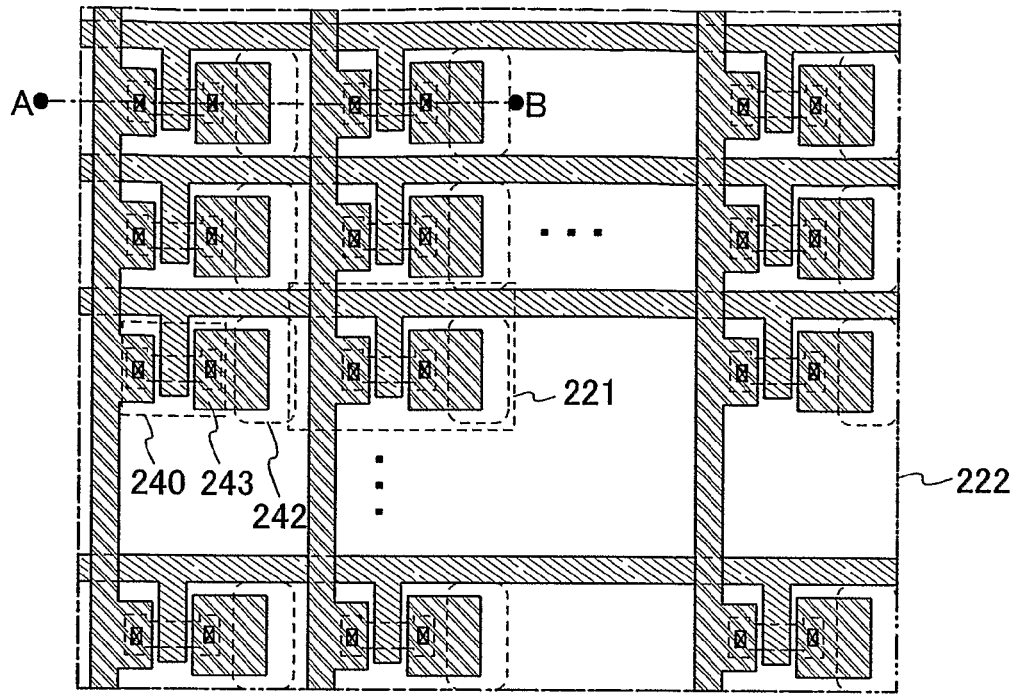
FIGS. 6A to 6C are a top view and cross-sectional views explaining a memory device according to the invention.
Figure 6B:
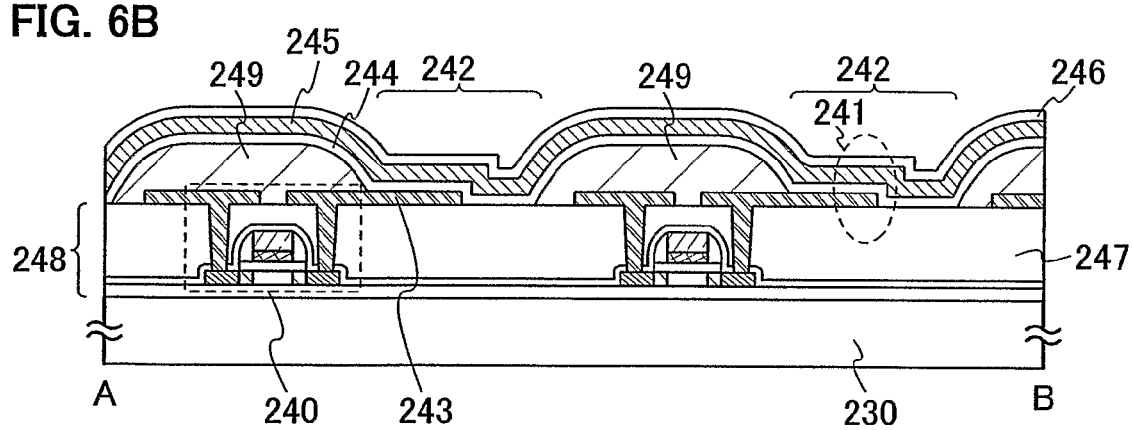

The memory cell array 222 includes a plurality of transistors 240 functioning as a switching element and memory elements 241 connected to the transistor 240 over a substrate 230 having an insulating surface (refer to FIGS. 6A and 6B). The memory element 241 includes a first conductive layer 243 formed over an insulating layer 247; a partition wall (insulating layer) 249 which covers a part of the first conductive layer 243; an insulating layer 244 which covers an edge portion of the first conductive layer 243, the insulating layer 247, and the partition wall (insulating layer) 249; and a second conductive layer 245. The insulating layer 244 is provided by being interposed between the first conductive layer 243 and the second conductive layer 245. The partition wall (insulating layer) 249 has an opening portion 242. In the opening portion 242, the insulating layer 244 covers the edge portion of the first conductive layer 243 and a part of the insulating layer 247. In addition, a TFT is used as the transistor 240 (refer to FIG. 6B).

Further, the transistor 240 may have any structure as long as the transistor 240 functions as a switching element. Typically, an organic transistor may be formed using an organic compound. FIG. 6A shows an example of providing a planar thin film transistor over a substrate having an insulating surface; however, the transistor can be formed to have a structure such as a staggered type or an inversely staggered type.

Figure 6C:
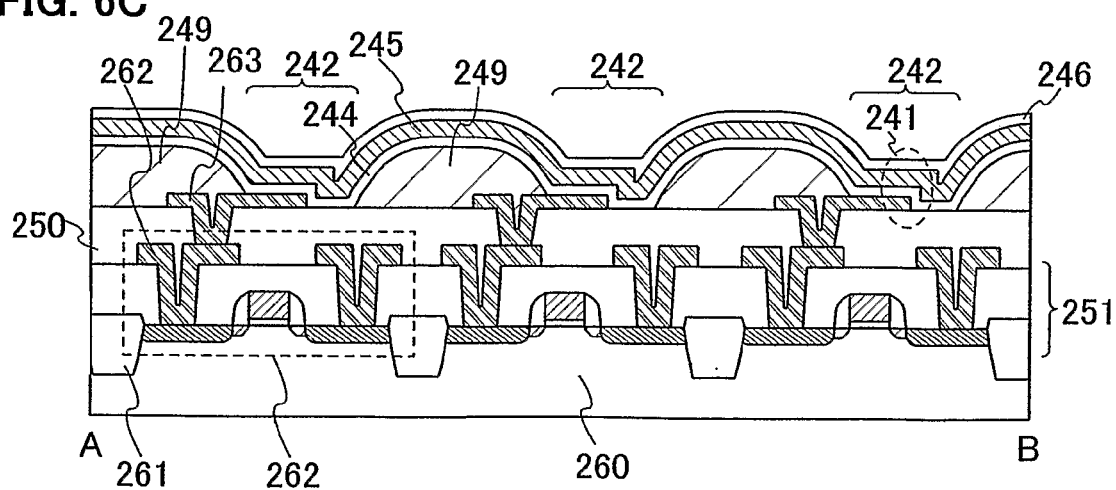

In addition, the transistor may be formed using a single crystal substrate or a SOI (silicon on insulator) substrate and a memory element may be provided thereover. The SOI substrate may be formed by using a method for attaching wafers or a method referred to as SIMOX (separation by implanted oxygen), by which an insulating layer is formed inside by implanting oxygen ions into a Si substrate. Here, as shown in FIG. 6C, the memory element 241 is connected to a field effect transistor 262 provided on a single crystal semiconductor substrate 260. Further, an insulating layer 250 is provided so as to cover a source electrode and a drain electrode of the field effect transistor 262, and the memory element 241 is provided over the insulating layer 250.

The memory element 241 includes a first conductive layer 263 formed over an insulating layer 250; a partition wall (insulating layer) 249 which covers a part of the first conductive layer 263; an insulating layer 244 which covers an edge portion of the first conductive layer 263, the insulating layer 250, and the partition wall (insulating layer) 249; and a second conductive layer 245. The insulating layer 244 is provided by being interposed between the first conductive layer 263 and the second conductive layer 245. The partition wall (insulating layer) 249 has an opening portion 242. In the opening portion 242, the insulating layer 244 covers the edge portion of the first conductive layer 263 and a part of the insulating layer 250.

As described above, by forming the memory element 241 with the insulating layer 250 provided, the first conductive layer 263 can be freely located. That is to say, it is necessary to provide the memory element 241 in a region which avoids a source electrode or a drain electrode of the transistor 240 in the structure of FIGS. 6A and 6B; however, by having the structure as described above, for example, the memory element 241 can be formed above the transistor 240 provided in an element forming layer 251. As a result, it is possible to realize high integration of the memory device 216 much more.

Although an example of providing the insulating layer 244 over the entire surface of the substrate is illustrated in the structure shown in FIGS. 6B and 6C, the insulating layer 244 may be selectively provided only in each memory cell. In this case, utilization efficiency of a material can be enhanced by selectively providing the insulating layer 244 by a droplet discharge method or the like.

In addition, a semiconductor layer included in a transistor may have any structure. For example, an impurity region (including a source region, a drain region, and an LDD region) may be formed, or any one of a p-channel type and an n-channel type may be employed. Further, an insulating layer (side wall) may be formed so as to be in contact with a side surface of a gate electrode, or a silicide layer may be provided to one or both of source/drain regions and a gate electrode. As a material for the silicide layer, nickel, tungsten, molybdenum, cobalt, platinum, or the like can be used.

Any one of the materials and the forming methods described in Embodiment Mode 1 can be used as a method and a forming method for forming the first conductive layers 243 and 263 and the second conductive layer 245.

In addition, the insulating layer 244 can be provided by using the same material and forming method as the insulating layer 29 as described in Embodiment Mode 1.

Further, a rectifying element may be provided between the first conductive layer 243 or 263, and the insulating layer 244. The rectifying element indicates a diode or a transistor in which a gate electrode and a drain electrode are connected. The rectifying element may be provided between the insulating layer 244 and the second conductive layer 245.

Figure 9:
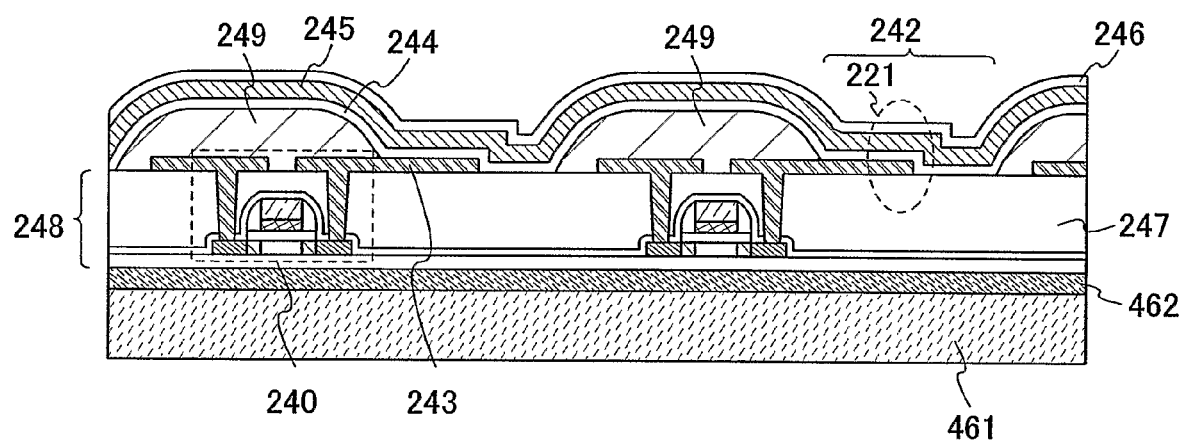
FIG. 9 is a cross-sectional view explaining a semiconductor device according to the invention.

Alternatively, after providing a separation layer over a substrate 230 and forming a memory element 241 and a layer 248 including a plurality of transistors over the separation layer, the memory element 241 and the layer 248 including a plurality of transistors may be separated from the separation layer and may be attached to a substrate 461 through an adhesive layer 462 (refer to FIG. 9). As a separation method, the following method or the like may be used: (1) a method for separating a layer including a plurality of transistors after providing a metal oxide film between a substrate having high heat resistance and the layer including a plurality of transistors and then embrittling the metal oxide film by crystallization; (2) a method for separating a layer including a plurality of transistors from a light-transmitting substrate after providing an amorphous silicon film containing hydrogen between the light-transmitting substrate and the layer including a plurality of transistors and then removing the amorphous silicon film by irradiating the amorphous silicon film containing hydrogen with laser light or by etching; (3) a method for mechanically eliminating a substrate having high heat resistance provided with a plurality of transistors; (4) a method for physically separating a layer including a plurality of transistors by an embrittled metal oxide film after providing a separation layer and a metal oxide film between a substrate having high heat resistance and the layer including a plurality of transistors, then embrittling the metal oxide film by crystallization, and then removing a part of the separation layer by etching with the use of a solution, $NF_3$, a halogen fluoride gas such as $BrF_3$, or $ClF_3$; (5) a method for physically separating the memory element 241 and the layer 248 including a plurality of transistors from the substrate 230 with the use of an embrittled metal oxide film after providing a separation layer and a metal oxide film between the substrate 230 and the layer 248 including a plurality of transistors, embrittling the metal oxide film, and then forming an opening portion (opening portion which exposes a part of the separation layer) by irradiating a part of an insulating layer 249 and an insulating layer which insulates a conductive layer of a transistor 240 with laser light, in which a substrate having heat resistance is used for the substrate 230; or the like.

Further, a small-sized, thin, and lightweight memory device can be attempted by using a flexible substrate shown by the substrate 30 in Embodiment Mode 1, a film including an adhesive layer on which thermo-compression bonding can be conducted, a paper formed from a fiber material, or the like as the substrate 461.

Figure 5:
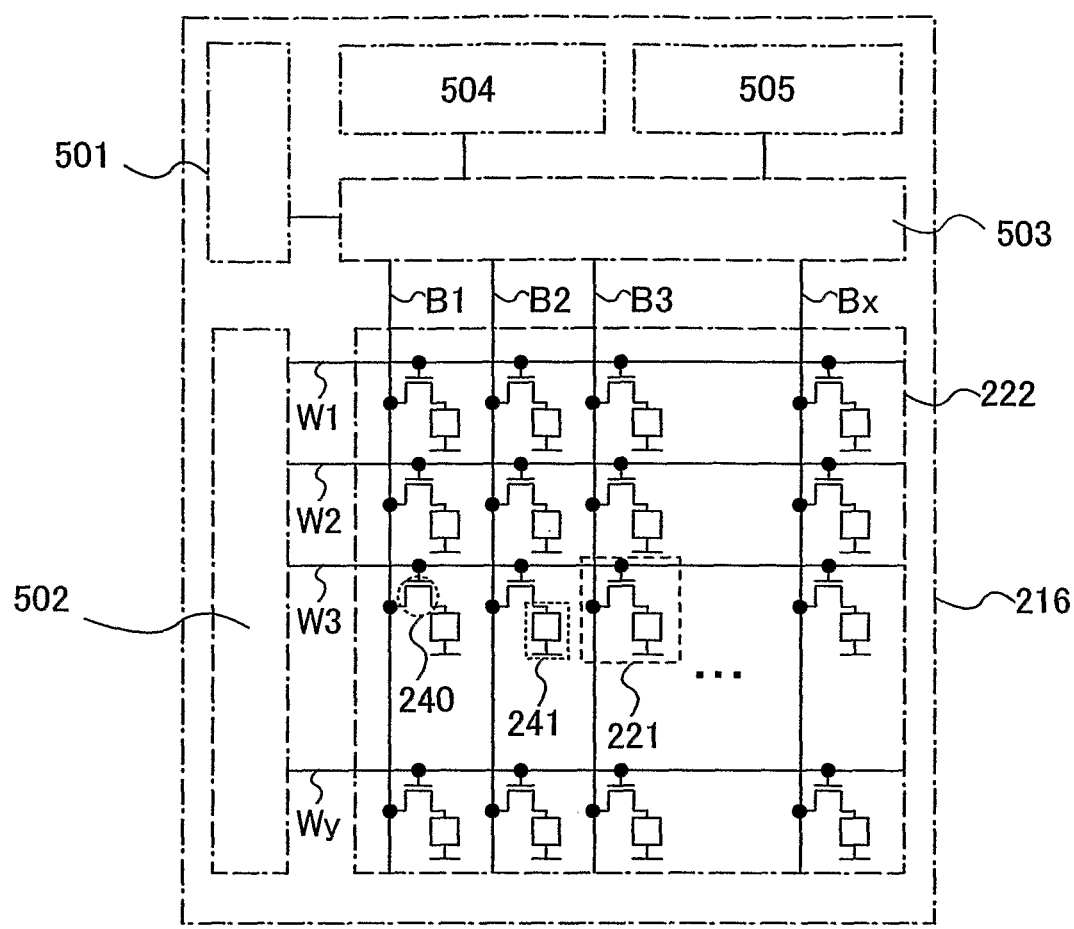
FIG. 5 is a diagram explaining a memory device according to the invention.

Then, an operation of conducting writing of data to a memory device 216 will be described (FIG. 5). A writing circuit has the same structure as in FIG. 4B.

As shown in FIG. 5, a memory cell includes the transistor 240 and the memory element 241. The memory element is represented using a rectangle shape in the accompanying drawings of the present specification. In the transistor 240, a word line is connected to a gate electrode, a bit line is connected to one high concentration impurity region, and a first conductive layer of the memory element 241 is connected to the other high concentration impurity region. A second conductive layer of the memory element 241 is conducted to second conductive layers of all the memory elements in a memory cell array. In an operation of the memory device, namely in writing and reading, a constant potential is applied to the second conductive layer. Therefore, there is a case where the second conductive layer is referred to as a common electrode in the present specification.

Next, a writing operation will be explained, while an initial state in which conductivity of the memory element has not been changed is "0" and a short-circuit state in which conductivity of the memory element has been changed is "1". First, when an input signal WE turns to Hi, the column decoder 501 in which an address signal to specify a column gives a signal to the selector 503 of the specified column, and the selector 503 connects the bit line of the specified column to the output terminal Pw of the writing circuit. A bit line which is not specified is in a non-connection state (referred to as Floating), and an output potential Vw of the writing circuit becomes V1. Similarly, the row decoder 502, which has received an address signal to specify a row, applies a potential V2 to the word line of the specified row and 0V is applied to a word line which is not specified. According to the above-described operation, one memory element 241 corresponding to an address signal is selected. At this time, 0V is applied to the common electrode.

At the same time, by receiving the input signal DATA=Hi, the voltage generating circuit 701 can produce and output a potential V1 from the output terminal Pa. The timing control circuit 702 can produce signals S0 and S1 controlling the switches SW0 and SW1 from the input signals WE, DATA, CLK, power supply potential (VDD), and the like, and output the signals from the output terminals P0 and P1. The connections of switches SW0 and SW1 are converted by the signals, and the writing circuit 505 can output the potential V1 as the output potential Vw from the output terminal Pw.

In the selected memory element, according to the operation as described above, the potential V2 is applied to the word line, the potential V1 is applied to the bit line, and 0V is applied to the common electrode. Thus, impurity regions of the thin film transistor 240 are conducted, and the potential V1 of the bit line is applied to a lower electrode of the memory element. Consequently, the memory element is changed in conductivity and short-circuited, and accordingly, "1" is written.

When the input signal WE turns to Lo (low potential which does not allow writing), all the word lines have 0V, and all the bit lines and the common electrode are in a Floating state. At this time, the timing control circuit produces Lo as the signals S0 and S1, which are outputted from the output terminals P0 and P1. The output terminal Pw is in a Floating state. According to the operation described above, writing is not conducted.

Next, writing of "0" will be explained. Writing of "0" indicates writing which does not change conductivity of the memory element, and is accomplished by not applying voltage to the memory element, namely by keeping an initial state. First, similarly to writing of "1", when the input signal WE becomes Hi (high potential which allows writing), the column decoder 501, which has received an address signal to specify a column, gives a signal to the selector of the specified column. The selector 503 connects the bit line of the specified column to the output terminal Pw of the writing circuit. At this time, a bit line which is not specified is in a Floating state. Similarly, the row decoder 502, which has received an address signal to specify a row, applies a potential V2 to the word line of the specified row, and applies 0V to a word line which is not specified. According to the operation described above, one memory cell 507 corresponding to the address signal is selected. Here, 0V is applied to the common electrode.

At the same time, by receiving the input signal DATA=Lo, the timing control circuit 702 produces control signals S0=Hi and S1=Lo, which are outputted from the output terminals P0 and P1, respectively. By the control signals, the switch SW0 turns ON and the switch SW1 turns OFF, and 0V is outputted as the output potential Vw from the output terminal Pw.

In the selected memory cell, by the operation described above, V2 is applied to the word line and 0V is applied to the bit line and the common electrode. Therefore, no voltage is applied to the memory element and conductivity is not changed; and accordingly, "0", which is an initial state, is kept.

When the input signal WE turns to Lo, 0V is applied to all the word lines, and all the bit lines and the common electrode are in a Floating state. At the same time, the timing control circuit produces Lo as signals S0 and S1, which are outputted from the output terminals P0 and P1, respectively. The output terminal Pw is in a Floating state.

Thus, writing of "1" or "0" can be conducted.

The memory device according to the present embodiment mode includes a column decoder 2001, a row decoder 2002, a reading circuit 2003, a selector 2005, and a memory cell array 2006. The memory cell array 2006 includes bit lines Bm ($1 \leq m \leq x$), word lines Wn ($1 \leq n \leq y$), and x×y pieces of memory cells 2011 at intersection points of the bit lines and the word lines. In the present embodiment mode, the memory cell 2011 includes a transistor 2012, a memory element 2013, and a common electrode 2014 (refer to FIG. 11B). It is to be noted that an operation of reading is the same as in Embodiment Mode 1.

It is to be noted that the present embodiment mode can be freely combined with the above embodiment mode.

By including a memory element having an insulating layer which covers an edge portion of a first conductive layer, a drive voltage for writing of data can be reduced. As a result, a memory device and a semiconductor device consuming low power can be provided.

Embodiment Mode 3

In the present embodiment mode, one example of a semiconductor device including a memory device shown in the above embodiment mode will be described with reference to the drawings.

In the semiconductor device shown in the present embodiment mode, there is a feature that non-contact reading and writing of data are possible. The data transmission methods are classified broadly into three of an electromagnetic coupling method for communicating by mutual induction with a pair of coils disposed in the opposed positions, an electromagnetic induction method for communicating by an induction field, and an electric wave method for communicating by using electric waves. Any of these methods may be employed. In addition, an antenna used for transmitting of data can be provided in two ways. In one way, the antenna is provided over a substrate provided with a plurality of elements and memory elements. In the other way, a terminal portion is provided over a substrate provided with a plurality of elements and memory elements, and the antenna provided to another substrate is provided by being connected to the terminal portion.

First, one example of a structure of a semiconductor device in the case where an antenna is provided over a substrate provided with a plurality of elements and memory elements will be described with reference to FIGS. 7A and 7B.

Figure 7A:
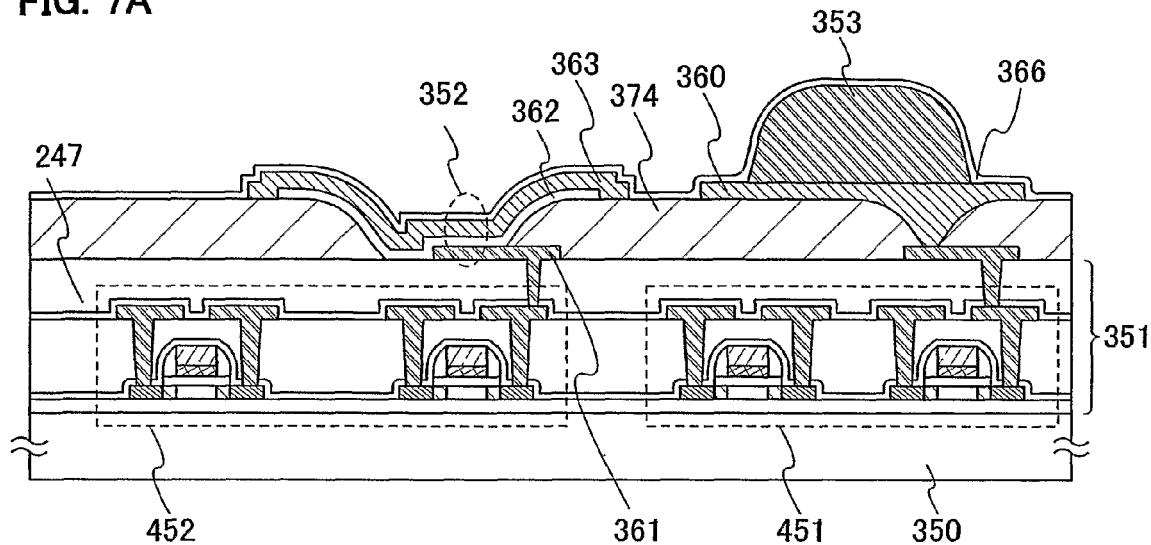
FIGS. 7A and 7B are cross-sectional views explaining a semiconductor device according to the invention.

FIG. 7A shows a semiconductor device including a memory device of a passive matrix type. An element forming layer 351 including transistors 451 and 452 is provided over a substrate 350, and a memory element 352 and a conductive layer 353 functioning as an antenna are provided above the element forming layer 351. Here, the transistor 452 constituting a part of the memory device, and the transistor 451 constituting a part of a power supply circuit, a clock generating circuit, or a data demodulation/modulation circuit are shown.

The case where the memory element 352, and the conductive layers 353 and a conductive layer 360 functioning as an antenna are provided above the element forming layer 351 is shown here, but the structure is not limited thereto, and the memory element 352 or the conductive layer 353 functioning as an antenna can be provided below the element forming layer 351 or in the same layer.

The memory element 352 includes a first conductive layer 361 formed over an insulating layer 247; a partition wall (insulating layer) 374 which covers a part of the first conductive layer; an insulating layer 362 which covers an edge portion of the first conductive layer 361, the insulating layer 247, and the partition wall (insulating layer) 374; and a second conductive layer 363. The insulating layer 362 is provided by being interposed between the first conductive layer 361 and the second conductive layer 363. The partition wall (insulating layer) 374 has an opening portion. In the opening portion, the insulating layer 362 covers the edge portion of the first conductive layer 361 and a part of the insulating layer 247. The semiconductor device further includes the conductive layer 360 connected to the transistor 451 and the conductive layer 353 formed over the conductive layer 360. The conductive layers 360 and 353 function as an antenna. Further, an insulating layer 366 functioning as a protective film, which covers the second conductive layer 363 and the conductive layer 353 functioning as an antenna, is formed. The first conductive layer 361 with which the memory element 352 is formed is connected to a source electrode or a drain electrode of one transistor. Although one memory element 352 is shown in FIG. 7A, a memory element is formed also in an edge portion of another side of the first conductive layer 361. The memory element 352 can be formed by using the material or the manufacturing method shown in the above embodiment mode.

In addition, in the memory element 352, a rectifying element may be provided between the first conductive layer 361 and the insulating layer 362, or between the insulating layer 362 and the second conductive layer 363 as described in the above embodiment mode. The rectifying element described above can be used.

Here, the conductive layer 353 functioning as an antenna is provided over the conductive layer 360, which is formed at the same time as the second conductive layer 363.

As a material for the conductive layer 353 functioning as an antenna, one of gold (Au), platinum (Pt), nickel (Ni), tungsten (W), molybdenum (Mo), cobalt (Co), copper (Cu), aluminum (Al), manganese (Mn), titanium (Ti), or the like or an alloy containing a plurality of the above materials can be used. In addition, as a method for forming the conductive layer 353 which functions as an antenna, vapor deposition, sputtering, CVD, various kinds of printing methods such as screen printing and gravure printing, a droplet discharge method, or the like can be used.

The transistors 240 and 262 shown in Embodiment Mode 2 can be appropriately used for the transistors 451 and 452 included in the element forming layer 351.

Figure 10A:
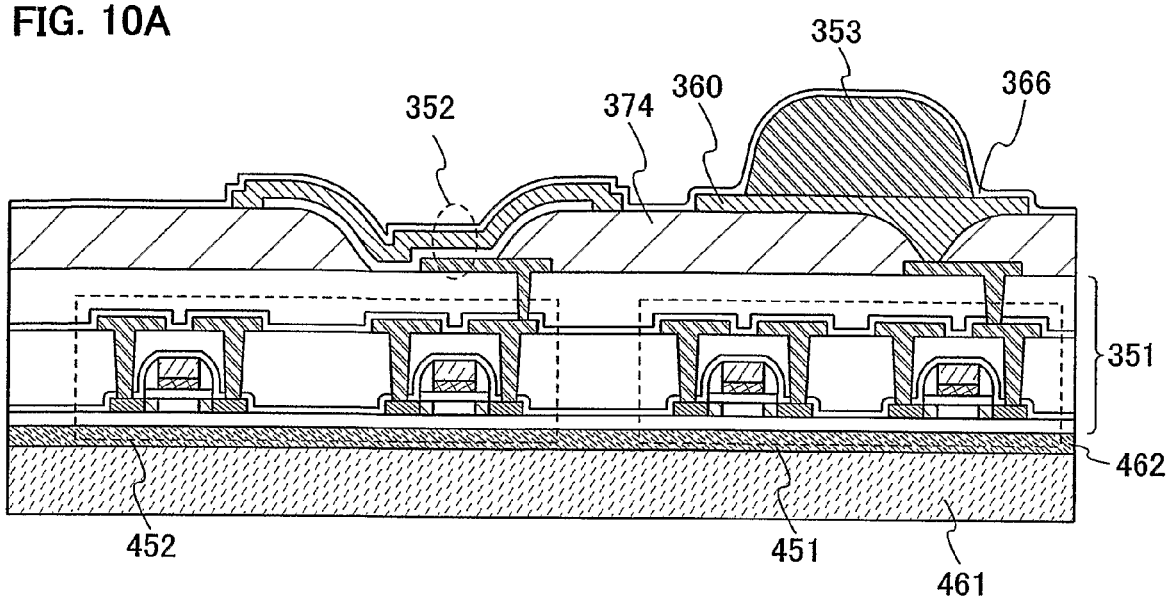
FIGS. 10A and 10B are cross-sectional views explaining a semiconductor device according to the invention.

Alternatively, the element forming layer 351, the memory element 352, and the conductive layer 353 functioning as an antenna may be separated from the substrate 350 using the separation method shown in Embodiment Mode 2 appropriately and may be attached to a substrate 461 using an adhesive layer 462 (refer to FIG. 10A). A small-sized, thin, and lightweight memory device can be realized by using a flexible substrate shown by the substrate 30 in Embodiment Mode 1, a film including an adhesive layer with which thermo-compression bonding can be conducted, a paper formed from a fiber material, or the like as the substrate 461.

Figure 7B:
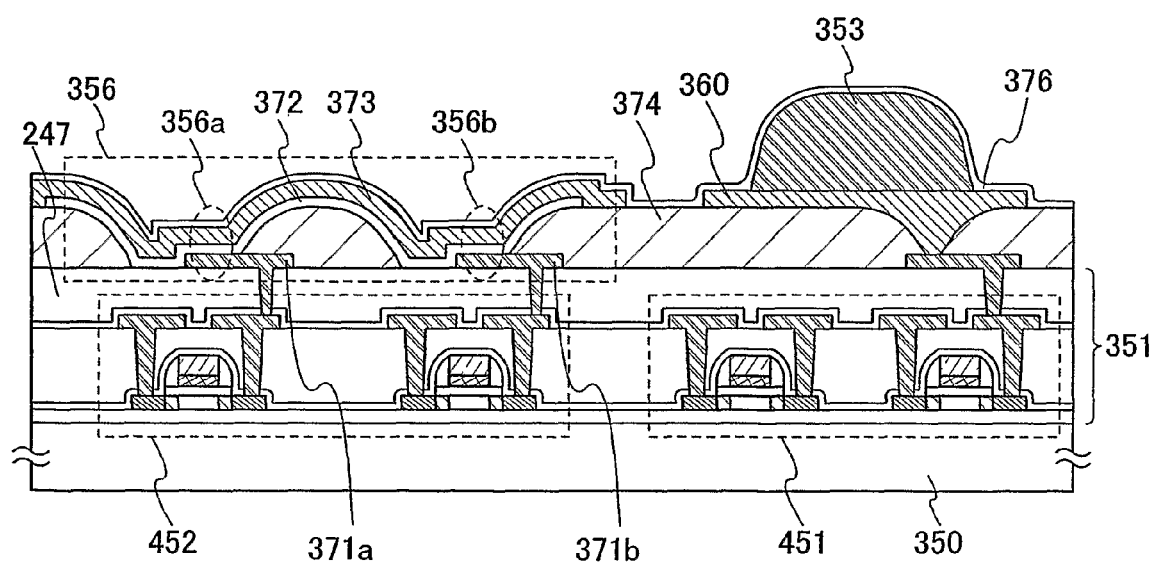

FIG. 7B shows one example of a semiconductor device including a memory device of an active matrix type. As for FIG. 7B, only different parts from FIG. 7A will be explained.

In the semiconductor device shown in FIG. 7B, an element forming layer 351 including transistors 451 and 452 is provided over a substrate 350, and a memory element portion 356 and conductive layers 353 and 360 functioning as an antenna are provided above the element forming layer 351. Here, a case is shown, where the transistor 452 functioning as a switching element of the memory element portion 356 is provided in the same layer as the transistor 451, and the memory element portion 356 and the conductive layer 353 functioning as an antenna are provided above the element forming layer 351. However, the present invention is not limited to this structure, and the transistor 452 may be provided above or below the element forming layer 351, or the memory element portion 356 or the conductive layer 353 functioning as an antenna may be provided below the element forming layer 351 or in the same layer.

The memory element portion 356 is formed by memory elements 356*a* and 356*b*. The memory element 356*a* includes a first conductive layer 371*a* formed over an insulating layer 247; a partition wall (insulating layer) 374 which covers a part of the first conductive layer 371*a*; an insulating layer 372 which covers an edge portion of the first conductive layer 371*a*, the insulating layer 247, and the partition wall (insulating layer) 374; and a second conductive layer 373. The insulating layer 372 is provided by being interposed between the first conductive layer 371*a* and the second conductive layer 373. The partition wall (insulating layer) 374 has an opening portion. In the opening portion, the insulating layer 372 covers the edge portion of the first conductive layer 371*a* and a part of the insulating layer 247. The memory element 356*b* includes a first conductive layer 371*b* formed over the insulating layer 247; the partition wall (insulating layer) 374 which covers a part of the first conductive layer 371*b*; the insulating layer 372 which covers an edge portion of the first conductive layer 371*b*, the insulating layer 247, and the partition wall (insulating layer) 374; and the second conductive layer 373. The insulating layer 372 is provided by being interposed between the first conductive layer 371*b* and the second conductive layer 373. The partition wall (insulating layer) 374 includes an opening portion. In the opening portion, the insulating layer 372 covers the edge portion of the first conductive layer 371*b* and a part of the insulating layer 247. Here, the first conductive layer 371*a* and the second conductive layer 371*b* are connected to a source electrode or a drain electrode in each transistor. In other words, each memory element is connected to one transistor.

The memory elements 356*a* and 356*b* can be formed by using the material or the manufacturing method shown in the above embodiment mode. In addition, also in the memory elements 356*a* and 356*b*, a rectifying element may be provided between the insulating layer 372 and the first conductive layers 371*a* or 371*b*, or between the insulating layer 372 and the second conductive layer 373 as described above.

The element forming layer 351, the memory element portion 356, and the conductive layer 353 functioning as an antenna can be formed by using vapor deposition, sputtering, CVD, a printing method, a droplet discharge method, or the like as described above. In addition, a different method may be used depending on each location.

Figure 10B:
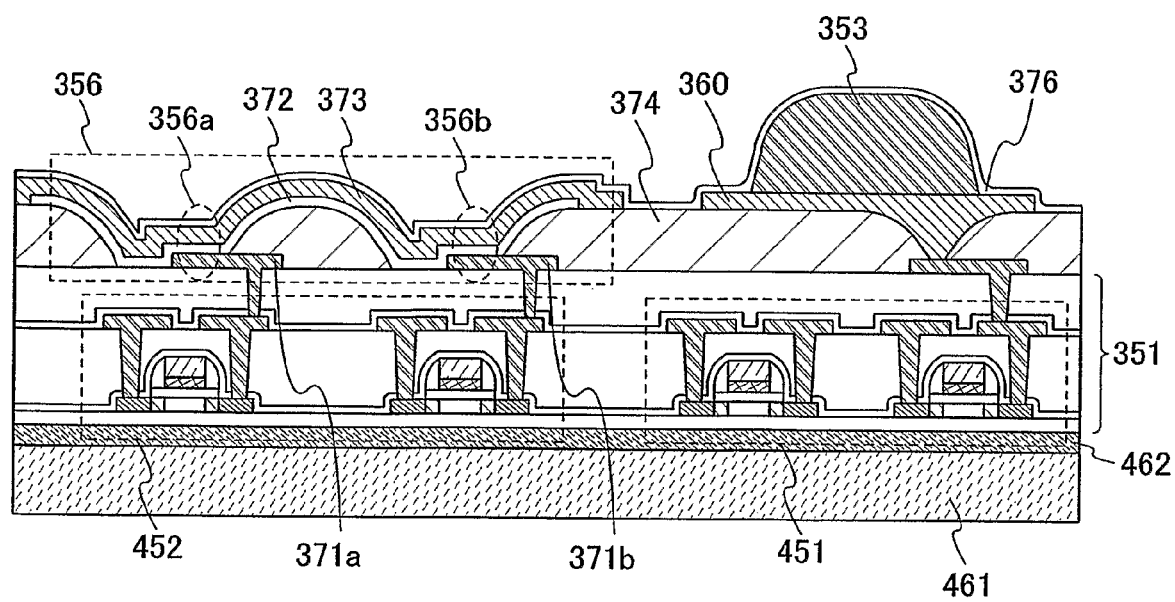

Alternatively, the element forming layer 351, the memory element portion 356, and the conductive layer 353 functioning as an antenna may be separated from a substrate using the separation method shown in Embodiment Mode 2 appropriately and may be attached to a substrate 461 using an adhesive layer 462 (refer to FIG. 10B).

In addition, a sensor connected to a transistor may also be provided. As the sensor, an element is given, which detects a temperature, humidity, illuminance, a gas, gravity, pressure, a sound (vibration), an acceleration, and other characteristics by physical or chemical means. The sensor is typically formed by an element such as a resistive element, a capacitive coupling element, an inductive coupling element, a photovoltaic element, a photoelectric conversion element, a thermal electromotive force element, a transistor, a thermistor, a diode, a piezoelectric element, or an electrostatic capacitive element.

Figure 8A:
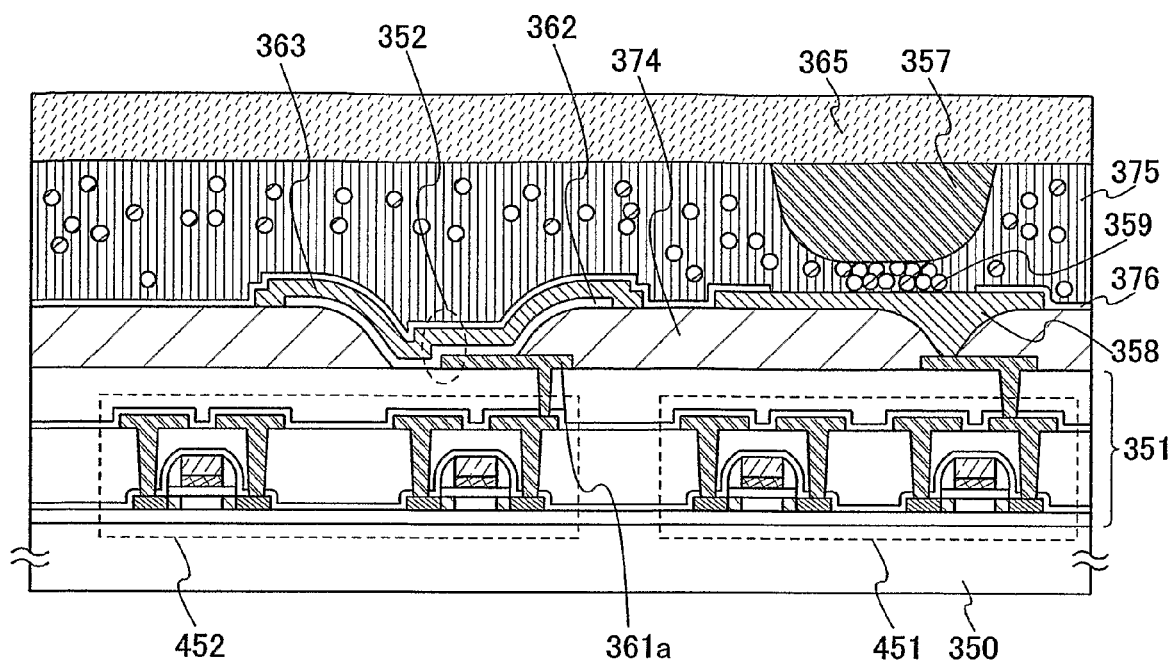
FIGS. 8A and 8B are cross-sectional views explaining a semiconductor device according to the invention.
Figure 8B:
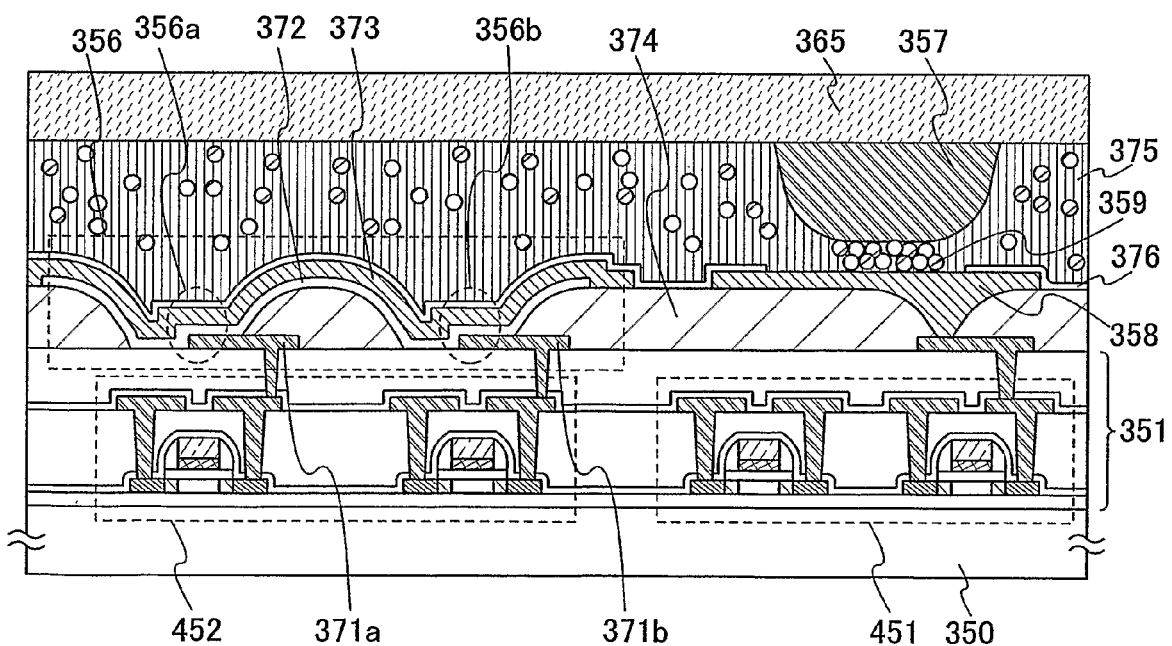

With reference to FIGS. 8A and 8B, one example of a structure of a semiconductor device will be described, in which a terminal portion is provided over a substrate provided with a plurality of elements and memory elements, and an antenna provided to another substrate is connected to the terminal portion. As for FIGS. 8A and 8B, only different parts from FIGS. 7A and 7B will be explained.

In a semiconductor device including a passive matrix type memory device shown in FIG. 8A, an element forming layer 351 is provided over a substrate 350, a memory element 352 is provided above the element forming layer 351, and a conductive layer 357 functioning as an antenna provided for a substrate 365 is formed so as to be electrically connected to the element forming layer. Here, the memory element 352 or the conductive layer 357 functioning as an antenna is provided above the element forming layer 351. However, the present invention is not limited to this structure, and the memory element portion 352 can be provided below the element forming layer 351 or in the same layer, or the conductive layer 357 functioning as an antenna can be provided below the element forming layer 351.

The memory element 352 can be formed by the memory element 352 having the structure shown in FIG. 7A.

The substrate 350 provided with the element forming layer 351 and the memory element 352 and the substrate 365 provided with the conductive layer 357 functioning as an antenna are attached to each other by a resin 375 having adhesiveness. Further, a connection terminal 358 and the conductive layer 357 are electrically connected to each other through a conductive fine particle 359 included in the resin 375. In addition, the substrate 350 provided with the element forming layer 351 and the memory element 352 and the substrate 365 provided with the conductive layer 357 functioning as an antenna may be attached to each other by using a conductive adhesive agent such as silver paste, copper paste, or carbon paste, or a method for conducting solder jointing.

FIG. 8B shows a semiconductor device provided with the memory device shown in the Embodiment Mode 2. An element forming layer 351 including transistors 451 and 452 is provided over a substrate 350, a memory element portion 356 is provided above the element forming layer 351, and a conductive layer 357 functioning as an antenna provided for a substrate 365 is provided so as to be connected to the element forming layer. Here, the transistor 452 is provided in the same layer as the transistor 451 in the element forming layer 351, and the conductive layer 357 functioning as an antenna is provided above the element forming layer 351. However, the present invention is not limited to this structure, and the memory element portion 356 can be provided below the element forming layer 351 or in the same layer, or the conductive layer 357 functioning as an antenna can be provided below the element forming layer 351.

Figure 15A:
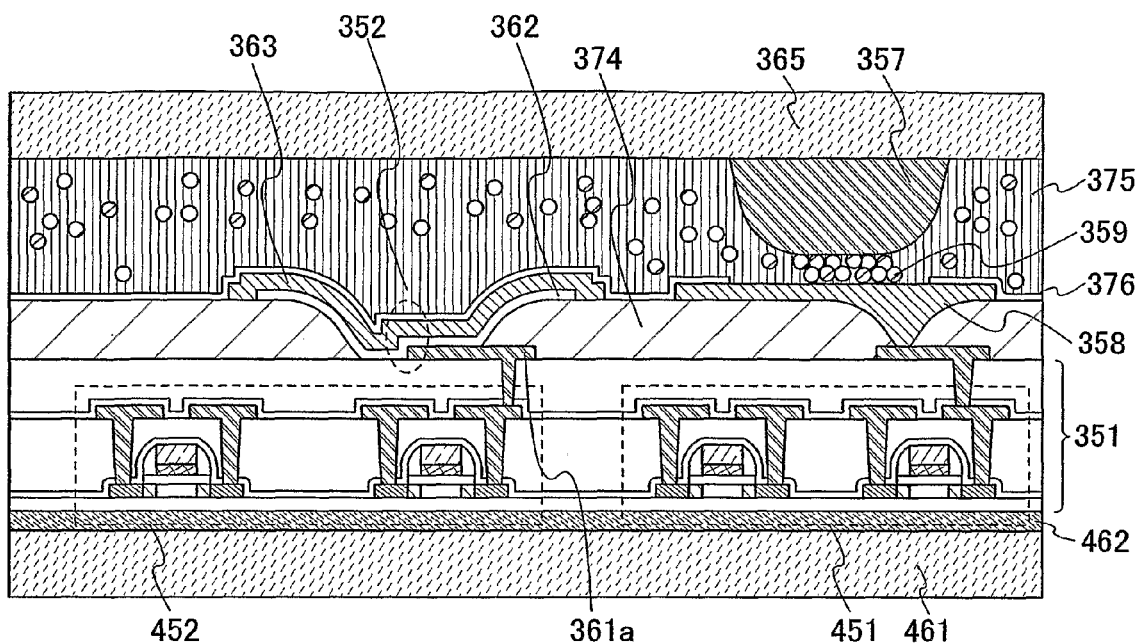
FIGS. 15A and 15B are cross-sectional views explaining a semiconductor device according to the invention.

Alternatively, the element forming layer 351, the memory element portion 356, and the conductive layer 357 functioning as an antenna may be separated from the substrate 350 using the separation method shown in Embodiment Mode 2 appropriately and may be attached to a substrate 461 using an adhesive layer 462 (refer to FIG. 15A).

The memory element portion 356 can be formed by memory elements 365*a* and 365*b* having the structure shown in FIG. 7B.

In addition, also in FIG. 8B, the substrate provided with the element forming layer 351 and the memory element portion 356 and the substrate 365 provided with the conductive layer 357 functioning as an antenna can be attached to each other by a resin 375 containing a conductive fine particle 359.

Figure 15B:
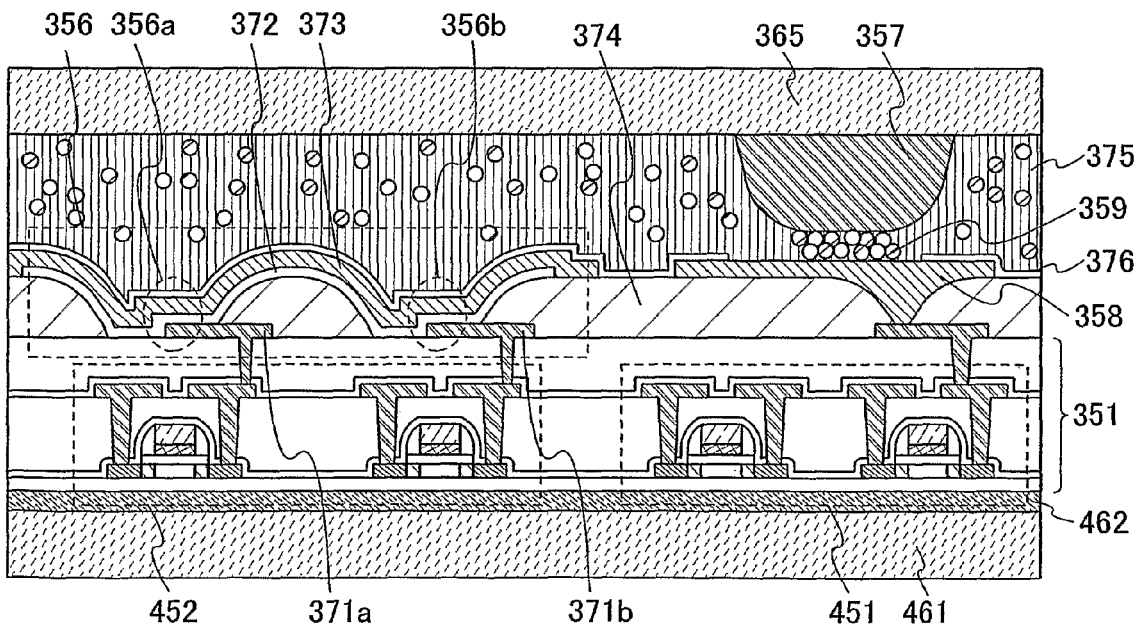

Alternatively, the element forming layer 351, the memory element portion 356, and the conductive layer 357 functioning as an antenna may be separated from the substrate 350 using the separation method shown in Embodiment Mode 2 appropriately and may be attached to a substrate 461 using an adhesive layer 462 (refer to FIG. 15B).

Furthermore, the memory elements 352, 356a, and 356b may be provided to the substrate 365 provided with the conductive layer functioning as an antenna. In addition, as in the semiconductor device shown in FIGS. 7A and 7B, a sensor connected to the transistor may also be provided.

It is to be noted that the present embodiment mode can be freely combined with the above embodiment mode.

By including a memory element having an insulating layer which covers an edge portion of a first conductive layer, a drive voltage for writing of data can be reduced. As a result, a memory device and a semiconductor device consuming low power can be provided.

Embodiment 1

Figure 12A:
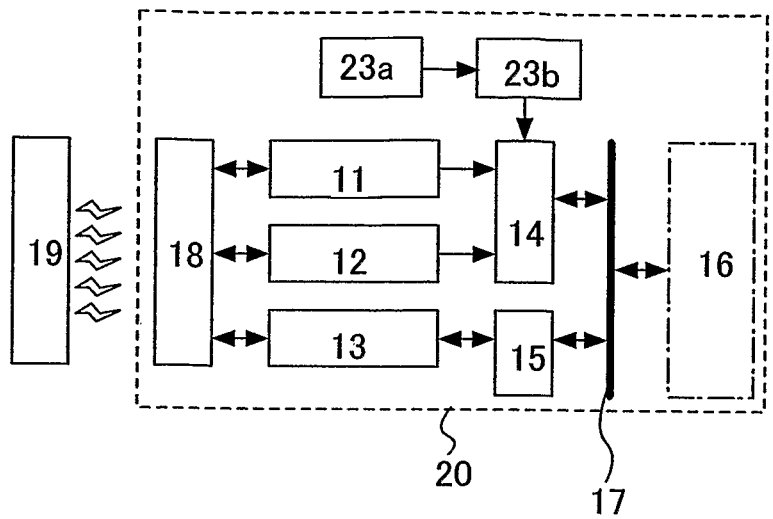
FIGS. 12A and 12B are a configuration example of a semiconductor device according to the invention and a view explaining an electronic device having the semiconductor device.
Figure 12B:
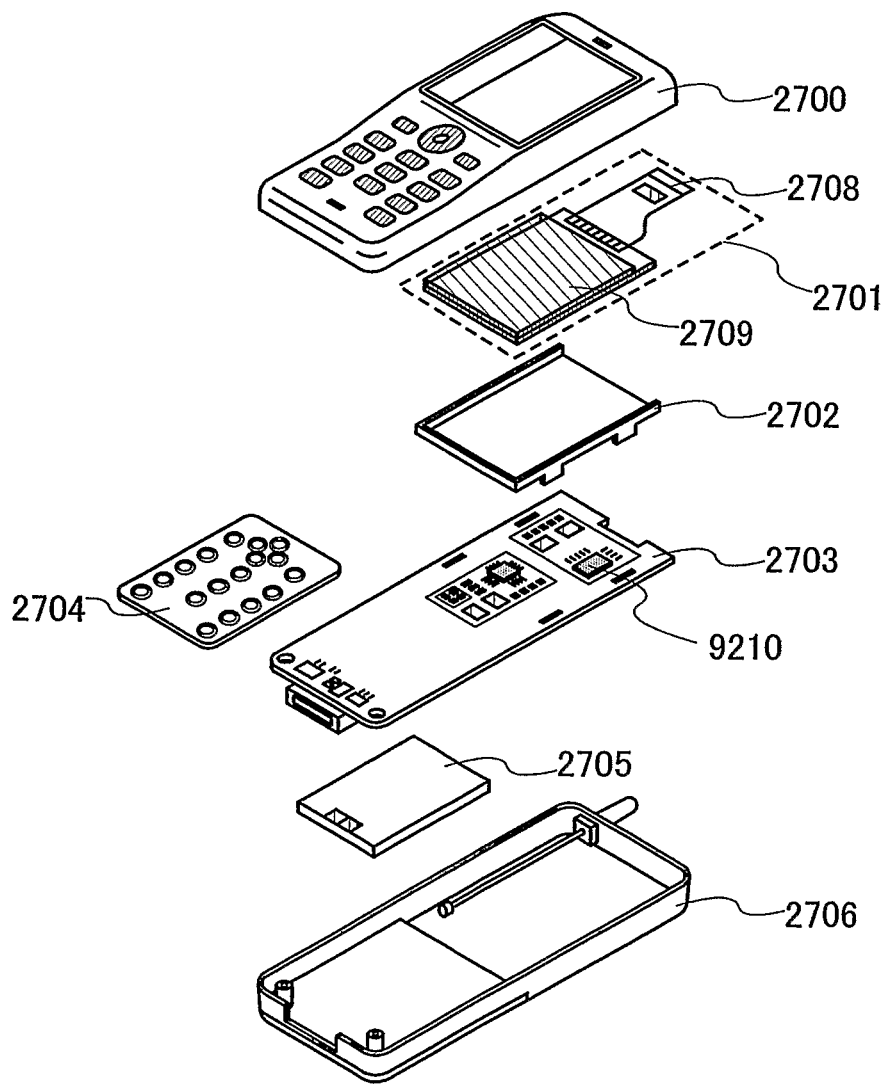

A structure of a semiconductor device of the present embodiment mode will be described with reference to FIGS. 12A and 12B. As shown in FIG. 12A, a semiconductor device 20 according to the present invention has a function of non-contact communication of data, and includes a power supply circuit 11, a clock generating circuit 12, a data demodulation/modulation circuit 13, a control circuit 14 for controlling other circuits, an interface circuit 15, a memory circuit 16, a data bus 17, an antenna 18 (antenna coil), a sensor 23a, and a sensor circuit 23b.

The power supply circuit 11 produces various kinds of voltages or currents to be supplied to each circuit inside the semiconductor device 20 based on an AC signal inputted from the antenna 18. The clock generating circuit 12 produces various kinds of clock signals to be supplied to each circuit inside the semiconductor device 20 based on an AC signal inputted from the antenna 18. The data demodulation/modulation circuit 13 has a function of demodulating/modulating data communicated with a reader/writer 19. The control circuit 14 has a function of controlling the memory circuit 16. The antenna 18 has a function of transmitting/receiving electromagnetic field. The reader/writer 19 communicates with and controls the semiconductor device, and processes the data thereof. It is to be noted that the structure of the semiconductor device is not limited to the above structure, and other elements, for example, a limiter circuit of a power supply voltage and hardware dedicated to encryption processing may be additionally provided.

The memory circuit 16 includes a memory element in which an insulating layer which is changed by light irradiation or an electric action from the outside is interposed between a pair of conductive layers. It is to be noted that the memory circuit 16 may include only the memory element in which an insulating layer is interposed between a pair of conductive layers, or may include another memory circuit having a different structure. The memory circuit having a different structure corresponds to, for example, one or more circuits of a DRAM, an SRAM, a FeRAM, a mask ROM, a PROM, an EPROM, an EEPROM, or a flash memory.

The sensor 23a is formed by an element such as a resistive element, a capacitive coupling element, an inductive coupling element, a photovoltaic element, a photoelectric conversion element, a thermal electromotive force element, a transistor, a thermistor, a diode, a piezoelectric element, or an electrostatic capacitive element. The sensor circuit 23b detects a change in impedance, reactance, inductance, voltage, or current, and performs analog/digital conversion (A/D conversion) to output a signal to the control circuit 14.

Embodiment 2

Figure 13A:
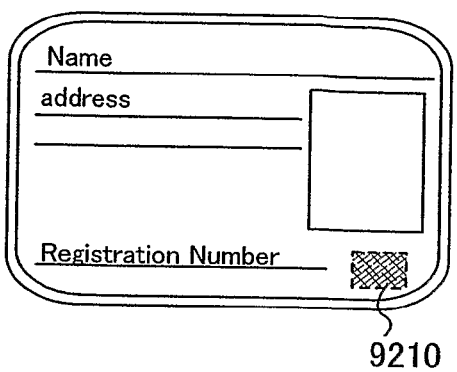
FIGS. 13A to 13F are views explaining a usage mode of a semiconductor device according to the invention.
Figure 13B:
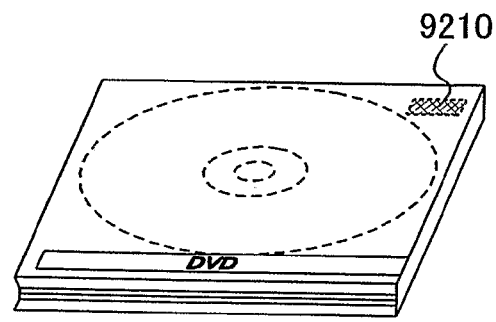
Figure 13C:
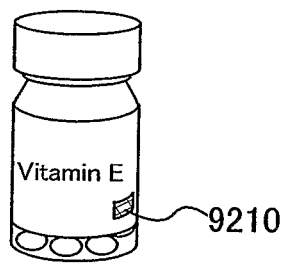
Figure 13D:
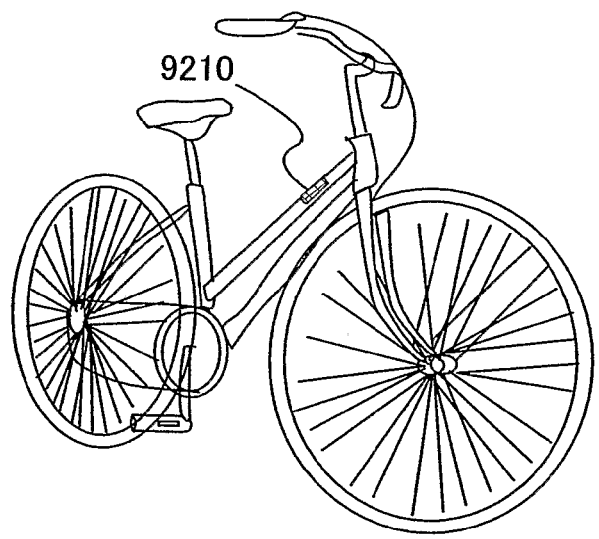
Figure 13E:
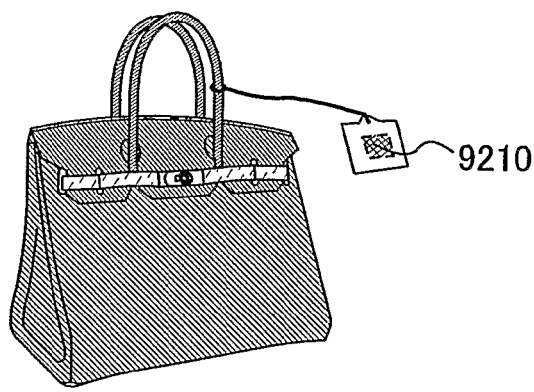
Figure 13F:
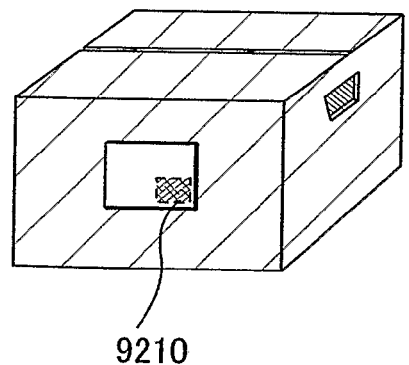

In accordance with the present invention, a semiconductor device functioning as a wireless chip can be formed. A semiconductor device 9210 can be used broadly, and may be used by being mounted in products such as, bills, coins, securities, bearer bonds, certificates (driver's licenses, resident cards, and the like, refer to FIG. 13A), containers for wrapping objects (wrapping paper, bottles, and the like, refer to FIG. 13C), recording media (DVDs, video tapes, and the like, refer to FIG. 13B), vehicles (bicycles and the like, refer to FIG. 13D), personal belongings (bags, glasses, and the like), foods, plants, clothes, livingware, and electronic equipment, or objects such as shipping tags of baggage (refer to FIGS. 13E and 13F). The electronic equipment indicates a liquid crystal display device, an EL display device, a television unit (also simply referred to as a TV, a TV set, or a TV receiver), a cellular phone, or the like.

The semiconductor device 9210 according to the present invention is mounted on a printed substrate, attached to a surface, or incorporated to be fixed in an object. For example, the semiconductor device is incorporated in paper of a book, or an organic resin of a package to be fixed in each object. As for the semiconductor device 9210 according to the present invention, a small size, a thin shape and lightweight is achieved and an attractive design of the object itself is not damaged even after being fixed in the object. In addition, by providing the semiconductor device 9210 according to the present invention in bills, coins, securities, bearer bonds, certificates, and the like, a certification function can be obtained and forgery thereof can be prevented by making the use of the certification function. Further, by providing the semiconductor device 9210 according to the present invention in containers for wrapping objects, recording media, personal belongings, foods, clothes, livingware, electronic equipment, and the like, a system such as an inspection system can be performed efficiently.

Subsequently, an example of electronic equipment mounted with the semiconductor device according to the present invention will be described with reference to the drawing. The electronic equipment illustrated here is a cellular phone, which includes chassis 2700 and 2706, a panel 2701, a housing 2702, a printed wiring board 2703, operation buttons 2704, and a battery 2705 (refer to FIG. 12B). The panel 2701 is incorporated in the housing 2702 to be detachable, and the housing 2702 is fitted to the printed wiring board 2703. As for the housing 2702, a shape and a size thereof are appropriately changed depending on electronic equipment in which the panel 2701 is incorporated. A plurality of semiconductor devices which are packaged are mounted on the printed wiring board 2703, and as one of the semiconductor devices, the semiconductor device 9210 according to the present invention can be used. A plurality of semiconductor devices mounted on the printed wiring board 2703 have a function of a controller, a central processing unit (CPU), a memory, a power supply circuit, a sound processing circuit, a transmit/receive circuit, or the like.

The panel 2701 is connected to the printed wiring board 2703 through a connection film 2708. The panel 2701, the housing 2702, and the printed wiring board 2703 are stored in the chassis 2700 and 2706 with the operation buttons 2704 and the battery 2705. A pixel region 2709 included in the panel 2701 is disposed so as to be visually recognized by an aperture provided in the chassis 2700.

As described above, the semiconductor device 9210 according to the present invention has features of a small size, a thin shape, and lightweight. By these features, limited space inside the chassis 2700 and 2706 of the electronic equipment can be used efficiently.

The semiconductor device according to the present invention can conduct writing of data to the memory element by applying lower voltage than conventional one, and electronic equipment using a semiconductor device of low power consumption can be provided.

In addition, the memory device included in the semiconductor device according to the present invention can conduct writing of data by an electric action, and has a feature that the memory device is nonvolatile and can conduct rewriting of data. Therefore, electronic equipment using the semiconductor device by which forgery due to rewriting can be prevented and new data can be additionally written can be provided.

It is to be noted that the chassis 2700 and 2706 are shown as one example of an appearance shape of a cellular phone, and the electronic equipment relating to the present embodiment can be changed to various modes in accordance with a function or an application thereof.

Embodiment 3

Figure 16A:
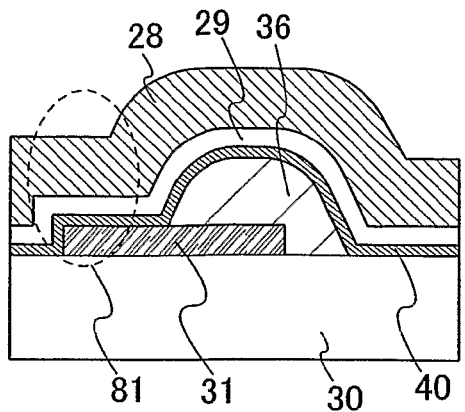
FIGS. 16A to 16D are explanatory cross-sectional views of a memory element according to the invention and a memory element of a comparative example.
Figure 16B:
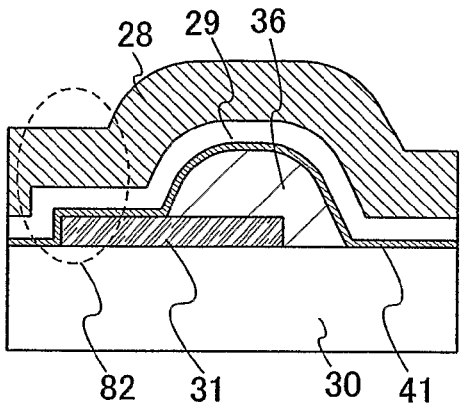
Figure 16C:
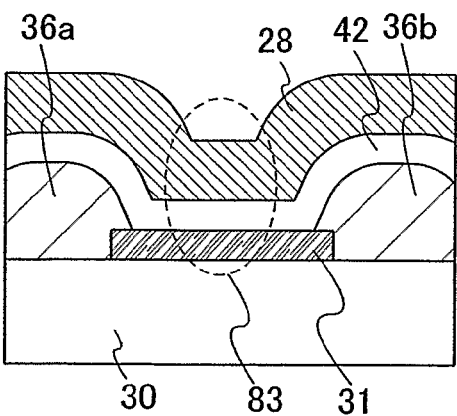
Figure 16D:
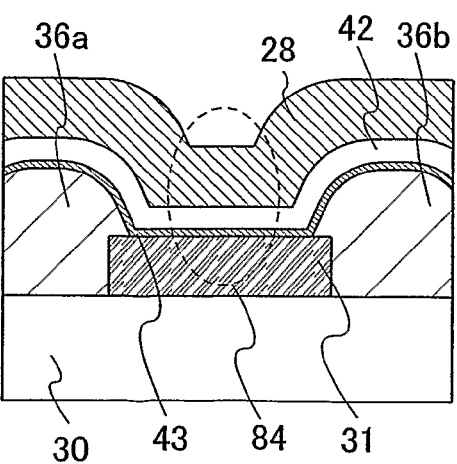
Figure 17:
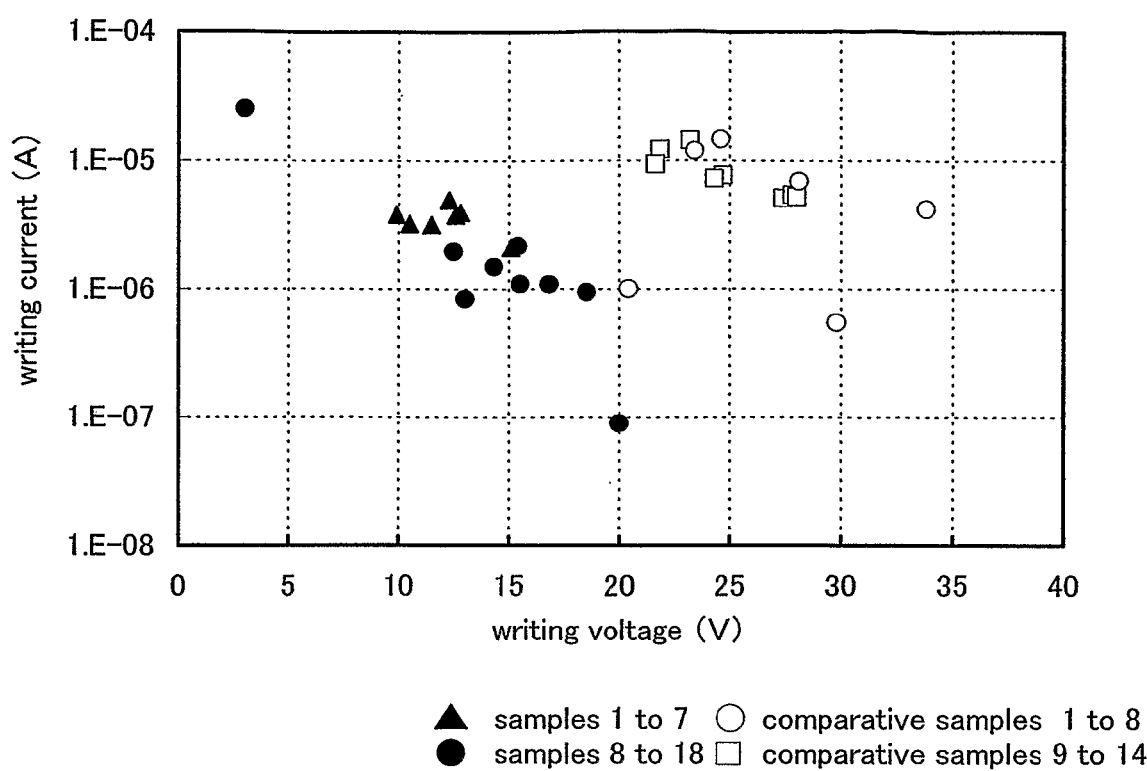
FIG. 17 is an explanatory view of a writing voltage and a writing current value of a memory element according to the invention and a memory element of a comparative example.

In this embodiment, Tables 1 to 4 and FIG. 17 show a writing voltage and a writing current value at the time of writing data electrically to samples 1 to 16 and comparative samples 1 to 14 having a structure of memory elements 81 to 84 over a substrate 30 as shown in FIGS. 16A to 16D. Here, writing is conducted with the memory element short-circuited by applying voltage to a first conductive layer and a second conductive layer of the memory element. In this embodiment, the writing voltages and the writing current values are compared between the memory elements (samples 1 to 16) having an insulating layers which cover edge portions of the first conductive layers like the memory element according to the present invention and the memory elements (comparative samples 1 to 14) having insulating layers which do not cover edge portions of the first conductive layers.

Table 1 shows writing voltages, writing current values, and lengths of sides of top surfaces of the memory elements of the samples 1 to 7. The samples 1 to 7 have a structure of the memory element 81, as shown in FIG. 16A, including a first conductive layer 31 extended in a first direction; a partition wall (insulating layer) 36, which covers part of the first conductive layer 31; a buffer layer 40 which covers the first conductive layer 31, a substrate 30, and the partition wall (insulating layer) 36; an insulating layer 29 formed over the buffer layer 40; and a second conductive layer 28 extended in a second direction perpendicular to the first direction, over the substrate 30 having an insulating surface.

TABLE 1

| Sample No. | Writing voltage (V) | Writing current (A) | Length of side (μm) |
| --- | --- | --- | --- |
| Sample 1 | 10.5 | 3.21E−06 | 5 |
| Sample 2 | 12.3 | 4.95E−06 | 5 |
| Sample 3 | 15.1 | 2.11E−06 | 5 |
| Sample 4 | 11.5 | 3.17E−06 | 5 |
| Sample 5 | 12.8 | 3.95E−06 | 5 |
| Sample 6 | 9.9 | 3.81E−06 | 5 |
| Sample 7 | 12.6 | 3.77E−06 | 5 |

As the structure of the memory element 81, a glass substrate is used as the substrate 30; a titanium layer having a thickness of 50 nm formed by sputtering, as the first conductive layer 31; a calcium fluoride layer having a thickness of 3 nm formed by vapor deposition, as the buffer layer 40; NPB having a thickness of 30 nm formed by vapor deposition, as the insulating layer 29; an aluminum layer having a thickness of 200 nm formed by vapor deposition, as the second conductive layer 28; and photosensitive polyimide having a thickness of 800 nm, as the partition wall (insulating layer) 36.

In FIG. 17, the writing voltages and the writing current values in Table 1 are represented by black triangles.

Table 2 shows writing voltages, writing current values, and lengths of sides of top surfaces of the memory elements of the samples 8 to 16. The samples 8 to 16 have a structure of the memory element 82, as shown in FIG. 16B, including a first conductive layer 31 extended in a first direction; a partition wall (insulating layer) 36, which covers an edge portion of the first conductive layer 31; a buffer layer 41, which covers the first conductive layer 31, a substrate 30, and the partition wall (insulating layer) 36; an insulating layer 29 formed over the buffer layer 41; and a second conductive layer 28 extended in a second direction perpendicular to the first direction, over the substrate 30 having an insulating surface.

TABLE 2

| Sample No. | Writing voltage (V) | Writing current (A) | Length of side (μm) |
| --- | --- | --- | --- |
| Sample 8 | 18.5 | 9.50E−07 | 5 |
| Sample 9 | 13 | 8.40E−07 | 5 |
| Sample 10 | 15.5 | 1.10E−06 | 5 |
| Sample 11 | 14.3 | 1.49E−06 | 5 |
| Sample 12 | 20 | 9.00E−08 | 5 |
| Sample 13 | 16.8 | 1.09E−06 | 10 |
| Sample 14 | 15.4 | 2.16E−06 | 5 |
| Sample 15 | 3 | 2.51E−05 | 5 |
| Sample 16 | 12.5 | 1.96E−06 | 3 |

As the structure of the memory element 82, a glass substrate is used as the substrate 30; a titanium layer having a thickness of 50 nm formed by sputtering, as the first conductive layer 31; a calcium fluoride layer having a thickness of 1 nm formed by vapor deposition, as the buffer layer 41; NPB having a thickness of 30 nm formed by vapor deposition, as the insulating layer 29; an aluminum layer having a thickness of 200 nm formed by vapor deposition, as the second conductive layer 28; and photosensitive polyimide having a thickness of 800 nm, as the partition wall (insulating layer) 36.

In FIG. 17, the writing voltages and the writing current values in Table 2 are represented by black circles.

Table 3 shows writing voltages, writing current values, and length of sides of top surfaces of the memory elements of the comparative samples 1 to 8. The comparative samples 1 to 8 have a structure of the memory element 83, as shown in FIG. 16C, including a first conductive layer 31 extended in a first direction; partition walls (insulating layers) 36a and 36b which cover a pair of edge portions of the first conductive layer 31; an insulating layer 42 formed over the first conductive layer 31 and the partition walls (insulating layers) 36a and 36b; and a second conductive layer 28 extended in a second direction perpendicular to the first direction, over a substrate 30 having an insulating surface.

TABLE 3

| Sample No. | Writing voltage (V) | Writing current (A) | Length of side (μm) |
| --- | --- | --- | --- |
| Comparative Sample 1 | 21.8 | 1.22E−05 | 5 |
| Comparative Sample 2 | 23.2 | 1.43E−05 | 5 |
| Comparative Sample 3 | 24.7 | 7.65E−06 | 3 |
| Comparative Sample 4 | 24.3 | 7.22E−06 | 3 |

TABLE 3-continued

| Sample No. | Writing voltage (V) | Writing current (A) | Length of side (μm) |
|---|---|---|---|
| Comparative Sample 5 | 21.6 | 9.40E−06 | 3 |
| Comparative Sample 6 | 27.4 | 5.10E−06 | 2 |
| Comparative Sample 7 | 27.8 | 5.39E−06 | 2 |
| Comparative Sample 8 | 28 | 5.23E−06 | 2 |

As the structure of the memory element 83, a glass substrate is used as the substrate 30; a titanium layer having a thickness of 50 nm formed by sputtering, as the first conductive layer 31; NPB having a thickness of 30 nm formed by vapor deposition, as the insulating layer 42; an aluminum layer having a thickness of 200 nm formed by vapor deposition, as the second conductive layer 28; and photosensitive polyimide having a thickness of 800 nm, as the partition walls (insulating layers) 36a and 36b.

In FIG. 17, the writing voltages and the writing current values in Table 3 are represented by an outline circle.

Table 4 shows writing voltages, writing current values, and lengths of sides of top surfaces of the memory elements of the comparative samples 9 to 14. The comparative samples 9 to 14 have a structure of the memory element 84, as shown in FIG. 16D, including a first conductive layer 31 extended in a first direction; partition walls (insulating layers) 36a and 36b which cover edge portions of the first conductive layer 31, respectively; a buffer layer 43 which covers the first conductive layer 31 and the partition wall (insulating layer) 36a and 36b; an insulating layer 42 formed over the buffer layer 43; and a second conductive layer 28 extended in a second direction perpendicular to the first direction, over a substrate 30 having an insulating surface.

TABLE 4

| Sample No. | Writing voltage (V) | Writing current (A) | Length of side (μm) |
|---|---|---|---|
| Comparative Sample 9 | 23.4 | 1.19E−05 | 5 |
| Comparative Sample 10 | 24.6 | 1.46E−05 | 5 |
| Comparative Sample 11 | 28.1 | 6.92E−06 | 3 |
| Comparative Sample 12 | 29.8 | 5.50E−07 | 3 |
| Comparative Sample 13 | 33.8 | 4.21E−06 | 2 |
| Comparative Sample 14 | 20.4 | 1.01E−06 | 2 |

As the structure of the memory element 84, a glass substrate is used as the substrate 30; a titanium layer having a thickness of 100 nm formed by sputtering, as the first conductive layer 31; a calcium fluoride layer having a thickness of 1 nm formed by vapor deposition, as the buffer layer 43; NPB having a thickness of 30 nm formed by vapor deposition, as the insulating layer 42; an aluminum layer having a thickness of 200 nm formed by vapor deposition, as the second conductive layer 28; and photosensitive polyimide having a thickness of 800 nm, as the partition walls (insulating layers) 36a and 36b.

In FIG. 17, the writing voltages and the writing current values in Table 4 are represented by an outline square.

As shown in FIG. 17, it is revealed that the writing voltages of the memory elements 81 and 82 having a structure according to the invention are lower than those of the memory elements 83 and 84. Accordingly, power consumption can be lowered by using the memory elements 81 and 82 according to the invention for a memory device and a semiconductor device.

This application is based on Japanese Patent Application serial No. 2005-035297 field in Japan Patent Office on Feb. 10, 2005, the contents of which are hereby incorporated by reference.

EXPLANATION OF REFERENCE

11: power supply circuit, 12: clock generating circuit, 13: data demodulation/modulation circuit, 14: control circuit, 15: interface circuit, 16: memory circuit, 17: data bus, 18: antenna, 19: reader/writer, 20: semiconductor device, 21: memory cell, 22: memory cell array, 24: memory cell array, 26: opening, 27: insulating layer, 28: conductive layer, 29: insulating layer, 30: substrate, 31: conductive layer, 32: conductive layer, 33: conductive layer, 34: conductive layer, 35: conductive layer, 36: partition wall (insulating layer), 36a: partition wall (insulating layer)37: interlayer insulating layer, 38: partition wall (insulating layer), 39: insulating layer, 40: buffer layer, 41: buffer layer, 42: insulating layer, 43: buffer layer, 80: memory element, 81: memory element, 82: memory element, 83: memory element, 84: memory element, 107: thin film transistor, 216: memory device, 221: memory cell, 222: memory cell array, 230: substrate, 23a: sensor, 23b: sensor circuit, 240: transistor, 241: memory element, 242: opening, 243: conductive layer, 244: insulating layer, 245: conductive layer, 247: insulating layer, 248: layer, 249: partition wall (insulating layer), 250: insulating layer, 251: element forming layer, 260: single crystal semiconductor substrate, 262: field effect transistor, 263: conductive layer, 28a: conductive layer, 29a: insulating layer, 29b: region, 31a: edge portion, 32a: edge portion, 33a: edge portion, 34a: edge portion, 350: substrate, 351: element forming layer, 352: memory element, 353: conductive layer, 356: memory element portion, 357: conductive layer, 358: connecting terminal, 359: electrically conductive fine particle, 35a: edge portion, 360: conductive layer, 361: conductive layer, 362: insulating layer, 363: conductive layer, 365: substrate, 366: insulating layer, 372: insulating layer, 373: conductive layer, 374: partition wall (insulating layer), 375: resin, 451: transistor, 452: transistor, 461: substrate, 462: adhesive layer, 501: column decoder, 502: row decoder, 503: selector, 504: circuit, 505: circuit, 507: memory element, 508: memory device, 701: voltage generation circuit, 702: timing control circuit, 2001; column decoder, 2002: row decoder, 2003: circuit, 2005: selector, 2006: memory cell array, 2007: voltage generation circuit, 2008: sense amplifier, 2009: resistive element, 2010: data output circuit, 2011: memory cell, 2012: transistor, 2013: memory element, 2014: common electrode, 2110: data output circuit, 2113: memory element, 2115: I-V characteristic, 2116: I-V characteristic, 2117: I-V characteristic, 2700: chassis, 2701: panel, 2702: housing, 2703: printed wiring board, 2704: operation button, 2705: battery, 2708: connection film, 2709: pixel area, 356a: memory element, 356b: memory element, 371a: conductive layer, 371b: conductive layer, 9210: semiconductor device

The invention claimed is:

1. A memory device comprising:
a first conductive layer over an insulating surface;
a second conductive layer;

a first insulating layer between the first conductive layer and the second conductive layer; and a second insulating layer over and in contact with a first edge portion of the first conductive layer and the insulating surface, wherein the first insulating layer is over and in contact with a second edge portion of the first conductive layer, the insulating surface, and the second insulating layer, wherein the first insulating layer is in contact with one side surface and a top surface of the first conductive layer, and wherein the second insulating layer is in contact with another side surface and the top surface of the first conductive layer.

2. A memory device comprising:
a memory cell array in which memory cells are arranged in matrix; and
a writing circuit,
wherein at least one of the memory cells comprises a memory element comprising:
  a first conductive layer over an insulating surface;
  a second conductive layer;
  a first insulating layer between the first conductive layer and the second conductive layer; and
  a second insulating layer over and in contact with a first edge portion of the first conductive layer and the insulating surface,
  wherein the first insulating layer is formed over and in contact with a second edge portion of the first conductive layer, the insulating surface, and the second insulating layer,
  wherein the first insulating layer is in contact with one side surface and a top surface of the first conductive layer, and
  wherein the second insulating layer is in contact with another side surface and the top surface of the first conductive layer.

3. A memory device according to claim 2, wherein the at least one of the memory cells comprises a transistor.

4. A memory device according to any one of claims 1 and 2, wherein the first conductive layer and the second conductive layer are partly connected to each other.

5. A memory device according to any one of claims 1 and 2, wherein the second edge portion of the first conductive layer is inclined with respect to the insulating surface in a range of 10 degrees or more and less than 85 degrees.

6. A memory device according to any one of claims 1 and 2, wherein the second edge portion of the first conductive layer has a curved surface.

7. A memory device according to claim 2, wherein the memory cell array and the writing circuit are provided over one of a glass substrate and a flexible substrate.

8. A memory device according to claim 2, wherein the writing circuit comprises a thin film transistor.

9. A memory device according to claim 2, wherein the memory cell array and the writing circuit are provided to a single crystal semiconductor substrate.

10. A memory device according to claim 9, wherein the writing circuit comprises a field effect transistor.

11. A memory device according to claim 1, wherein a resistance value of the memory device is changed by light irradiation.

12. A memory device according to any one of claims 1 and 2, wherein the first insulating layer comprises a conjugated polymer material doped with a photoacid generator.

13. A memory device according to claim 1, wherein a resistance value of the memory device is changed by an electric action.

14. A memory device according to any one of claims 1 and 2, wherein the first insulating layer comprises an organic compound.

15. A memory device according to any one of claims 1 and 2, wherein the first insulating layer comprises one of an electron transporting material and a hole transporting material.

16. A memory device according to any one of claims 1 and 2, wherein the first insulating layer comprises an inorganic insulating layer.

17. A memory device according to claim 2, wherein a resistance value of the memory element is changed by light irradiation.

18. A memory device according to claim 2, wherein a resistance value of the memory element is changed by an electric action.

19. A memory device according to claim 1, wherein the second insulating layer is a partition wall.

20. A memory device according to claim 2, wherein the second insulating layer is a partition wall.

21. A memory device according to claim 1, further comprising a third insulating layer covering the second conductive layer.

22. A memory device according to claim 2, further comprising a third insulating layer covering the second conductive layer.

23. A memory device according to claim 1,
wherein at least one of the first edge portion and the second edge portion has a convex curvature.

24. A memory device according to claim 2,
wherein at least one of the first edge portion and the second edge portion has a convex curvature.

25. A memory device according to claim 1,
wherein at least one of the first edge portion and the second edge portion has a stepped surface.

26. A memory device according to claim 2,
wherein at least one of the first edge portion and the second edge portion has a stepped surface.

27. A memory device according to claim 1,
wherein the first insulating layer comprises an organic compound having a hole mobility in the range of $10^{-6}$ cm$^2$/Vs to $10^{-2}$ cm$^2$/Vs.

28. A memory device according to claim 2,
wherein the first insulating layer comprises an organic compound having a hole mobility in the range of $10^{-6}$ cm$^2$/Vs to $10^{-2}$ cm$^2$/Vs.

29. A memory device according to claim 1,
wherein the first insulating layer comprises an organic compound having an electron mobility in the range of $10^{-6}$ cm$^2$/Vs to $10^{-2}$ cm$^2$/Vs.

30. A memory device according to claim 2,
wherein the first insulating layer comprises an organic compound having an electron mobility in the range of $10^{-6}$ cm$^2$/Vs to $10^{-2}$ cm$^2$/Vs.

31. A memory device according to claim 1,
wherein the first insulating layer has a mixed layer of an organic compound and an inorganic compound,
wherein the organic compound has an electron mobility in the range of $10^{-6}$ cm$^2$/Vs to $10^{-2}$ cm$^2$/Vs, and
wherein the inorganic compound has a hole mobility in the range of $10^{-6}$ cm$^2$/Vs to $10^{-2}$ cm$^2$/Vs.

32. A memory device according to claim 2,
wherein the first insulating layer has a mixed layer of an organic compound and an inorganic compound, wherein the organic compound has an electron mobility in the range of $10^{-6}$ cm$^2$/Vs to $10^{-2}$ cm$^2$/Vs, and wherein the inorganic compound has a hole mobility in the range of $10^{-6}$ cm$^2$/Vs to $10^{-2}$ cm$^2$/Vs.

* * * * *

UNITED STATES PATENT AND TRADEMARK OFFICE
CERTIFICATE OF CORRECTION

PATENT NO. : 8,604,547 B2
APPLICATION NO. : 11/795476
DATED : December 10, 2013
INVENTOR(S) : Mikio Yukawa et al.

It is certified that error appears in the above-identified patent and that said Letters Patent is hereby corrected as shown below:

Title Page, item (86) PCT No., "PCT/JP2006/002413" should instead be --PCT/JP2006/302413--;

In the Specifications

At column 9, line 26, "to, be" should be --to be--;

At column 12, line 45, "signals signal" should be --signals S0 and S1 controlling the switches SW0 and SW1, respectively, from a writing control signal--;

At column 13, line 50, "a" should be --$\alpha$--;

At column 14, line 3, "a" should be --$\alpha$--;

At column 14, line 10, "a" should be --$\alpha$--;

At column 14, line 22, "a" should be --$\alpha$--;

At column 14, line 25, "a" should be --$\alpha$--.

Signed and Sealed this
Sixth Day of May, 2014

Michelle K. Lee
*Deputy Director of the United States Patent and Trademark Office*